(12) United States Patent
Feng et al.

(10) Patent No.: US 11,455,936 B2
(45) Date of Patent: Sep. 27, 2022

(54) SHIFT REGISTER AND DRIVE METHOD THEREFOR, AND GATE DRIVE CIRCUIT

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 17/294,690

(22) PCT Filed: Aug. 20, 2020

(86) PCT No.: PCT/CN2020/110277
§ 371 (c)(1),
(2) Date: May 18, 2021

(87) PCT Pub. No.: WO2021/032166
PCT Pub. Date: Feb. 25, 2021

(65) Prior Publication Data
US 2022/0013060 A1 Jan. 13, 2022

(30) Foreign Application Priority Data
Aug. 21, 2019 (CN) .......................... 201910774312.0

(51) Int. Cl.
*G09G 5/00* (2006.01)
*G09G 3/20* (2006.01)
(Continued)

(52) U.S. Cl.
CPC ............. *G09G 3/2092* (2013.01); *G09G 3/20* (2013.01); *G09G 3/3266* (2013.01);
(Continued)

(58) Field of Classification Search
CPC ............... G09G 3/2092; G09G 3/3266; G09G 2300/0426; G09G 2310/0286;
(Continued)

(56) References Cited

U.S. PATENT DOCUMENTS

2016/0172054 A1* 6/2016 Shao .................... G11C 19/28
345/100
2018/0337682 A1* 11/2018 Takasugi .............. G09G 3/3266
(Continued)

FOREIGN PATENT DOCUMENTS

KR 2017078978 A * 7/2017 ........... G09G 3/3266

*Primary Examiner* — Adam J Snyder
(74) *Attorney, Agent, or Firm* — Ling Wu; Stephen Yang; Ling and Yang Intellectual Property

(57) ABSTRACT

A shift register and a drive method therefor, and a gate drive circuit. The shift register includes: an input sub-circuit, a detection control sub-circuit, an output sub-circuit, a first reset sub-circuit, and a pull-down sub-circuit. The detection control sub-circuit is respectively connected to a random detection signal end (OE), a signal input end (INPUT), a first clock signal end (CLKA), a first reset end (RST1), and a pull-up node (PU), and is configured to provide a signal of the first clock signal end (CLKA) for the pull-up node (PU) under the control of the signal input end (INPUT), the random detection signal end (OE), the first clock signal end (CLKA), and the first reset end (RST1).

15 Claims, 11 Drawing Sheets

(51) Int. Cl.
    *G11C 19/28*     (2006.01)
    *G09G 3/3266*    (2016.01)
(52) U.S. Cl.
    CPC .............. *G09G 2300/0426* (2013.01); *G09G 2310/0286* (2013.01); *G09G 2310/061* (2013.01); *G09G 2310/08* (2013.01); *G09G 2320/0233* (2013.01); *G09G 2320/0295* (2013.01); *G09G 2320/045* (2013.01); *G11C 19/28* (2013.01)
(58) Field of Classification Search
    CPC ......... G09G 2310/061; G09G 2310/08; G09G 2320/0233; G09G 2320/0295; G09G 2320/045; G09G 3/20; G11C 19/28
    See application file for complete search history.

(56) References Cited

U.S. PATENT DOCUMENTS

| | | | |
|---|---|---|---|
| 2019/0103049 A1* | 4/2019 | Noh | G09G 3/3677 |
| 2019/0130848 A1* | 5/2019 | Kim | G09G 3/3266 |
| 2019/0164478 A1* | 5/2019 | Kim | G09G 3/3233 |
| 2020/0074933 A1* | 3/2020 | Ban | G09G 3/3258 |
| 2020/0074937 A1* | 3/2020 | Choi | G09G 3/3266 |
| 2020/0135115 A1* | 4/2020 | Chang | G09G 3/3266 |

* cited by examiner

SHIFT REGISTER AND DRIVE METHOD THEREFOR, AND GATE DRIVE CIRCUIT

The present application claims the priority of Chinese Patent Application No. 201910774312.0 filed to the CNIPA on Aug. 21, 2019, entitled "Shift register and driving method thereof, gate driving circuit", the content of which is hereby incorporated by reference.

TECHNICAL FIELD

Embodiments of the present disclosure relate to, but are not limited to, the technical field of display, in particular to a shift register and a driving method thereof, a gate driving circuit.

BACKGROUND

A display panel includes a gate driving circuit and a pixel circuit arranged in an array. The gate driving circuit includes a plurality of shift registers. Different shift registers are connected with different rows of pixel circuits and are configured to provide scanning signals to the connected pixel circuits in a display stage. The pixel circuit includes a driving transistor. Due to the limitation of a manufacturing process of the driving transistor, the parameters of different driving transistors are different, which make the driving currents output by different pixel circuits different. In order to ensure the display effect of the display panel, sensing of the pixel circuit in a non-display stage may obtain parameters of the driving transistor for external compensation of the pixel circuit.

SUMMARY

The following is a summary of the subject matter described in detail in the present disclosure. This summary is not intended to limit the protection scope of the claims.

In a first aspect, the present disclosure provides a shift register, comprising: an input sub-circuit, a sensing control sub-circuit, an output sub-circuit, a first reset sub-circuit and a pull-down sub-circuit;

the input sub-circuit is connected with a signal input terminal, a first power supply terminal and a pull-up node respectively, and is configured to provide a signal of the first power supply terminal to the pull-up node under control of the signal input terminal;

the sensing control sub-circuit is connected with a random sensing signal terminal, the signal input terminal, a first clock signal terminal, a first reset terminal and the pull-up node, respectively and is configured to provide a signal of the first clock signal terminal to the pull-up node under control of the signal input terminal, the random sensing signal terminal, the first clock signal terminal and the first reset terminal;

the first reset sub-circuit is connected with the first reset terminal, the pull-up node and a second power supply terminal respectively, and is configured to provide a signal of the second power supply terminal to the pull-up node under control of the first reset terminal;

the output sub-circuit is connected with a second clock signal terminal, a third clock signal terminal, the pull-up node, a first output terminal and a second output terminal respectively, and is configured to provide a signal of the third clock signal terminal to the first output terminal and provide a signal of the second clock signal terminal to the second output terminal under control of the pull-up node; and the pull-down sub-circuit is connected with the first power supply terminal, the second power supply terminal, a third power supply terminal, the pull-up node, the first output terminal and the second output terminal respectively, and is configured to provide the signal of the second power supply terminal signal to the pull-up node and the second output terminal, and provide a signal of the third power supply terminal to the first output terminal under control of the first power supply terminal and the pull-up node.

In some possible implementations, the sensing control sub-circuit comprises a sensing node control sub-circuit and a sensing output sub-circuit;

the sensing node control sub-circuit is connected with the signal input terminal, a sensing node, the random sensing signal terminal, the pull-up node and the first reset terminal respectively, and is configured to provide the signal of the signal input terminal or the signal of the pull-up node to the sensing node under control of the signal input terminal, the random sensing signal terminal and the first reset terminal; and the sensing output sub-circuit is connected with the sensing node, the first clock signal terminal and the pull-up node respectively, and is configured to provide the signal of the first clock signal terminal to the pull-up node under control of the first clock signal terminal and the sensing node.

In some possible implementations, the shift register further comprises: a second reset sub-circuit;

the second reset sub-circuit is connected with the second reset terminal, the pull-up node, the sensing node and the second power supply terminal respectively, and is configured to provide the signal of the second power supply terminal to the pull-up node and the sensing node under control of the second reset terminal.

In some possible implementations, the sensing node control sub-circuit comprises a first transistor, a second transistor and a third transistor;

a control electrode and a first electrode of the first transistor are connected with the signal input terminal, and a second electrode of the first transistor is connected with the sensing node;

a control electrode of the second transistor is connected with the random sensing signal terminal, a first electrode of the second transistor is connected with the sensing node, and a second electrode of the second transistor is connected with a first electrode of the third transistor; and a control electrode of the third transistor is connected with the first reset terminal, and a second electrode of the third transistor is connected with the pull-up node.

In some possible implementations, the sensing output sub-circuit comprises a fourth transistor, a fifth transistor and a first capacitor;

a control electrode of the fourth transistor is connected with the sensing node, a first electrode of the fourth transistor is connected with a first clock signal terminal, and a second electrode of the fourth transistor is connected with a first electrode of the fifth transistor;

a control electrode of the fifth transistor is connected with the first clock signal terminal, and a second electrode of the fifth transistor is connected with the pull-up node;

a first terminal of the first capacitor is connected with the sensing node, and a second terminal of the first capacitor is connected with the second electrode of the fourth transistor.

In some possible implementations, the input sub-circuit comprises a sixth transistor;

a control electrode of the sixth transistor is connected with the signal input terminal, a first electrode of the sixth transistor is connected with the first power supply terminal, and a second electrode of the sixth transistor is connected with the pull-up node.

In some possible implementations, the output sub-circuit comprises a seventh transistor, an eighth transistor and a second capacitor;

a control electrode of the seventh transistor is connected with the pull-up node, a first electrode of the seventh transistor is connected with the second clock signal terminal, and a second electrode of the seventh transistor is connected with the second output terminal;

a control electrode of the eighth transistor is connected with the pull-up node, a first electrode of the eighth transistor is connected with the third clock signal terminal, and a second electrode of the eighth transistor is connected with the first output terminal; and a first terminal of the second capacitor is connected with the pull-up node, and a second terminal of the second capacitor is connected with the first output terminal.

In some possible implementations, the pull-down sub-circuit includes: a ninth transistor, a tenth transistor, an eleventh transistor, a twelfth transistor, and a thirteenth transistor;

a control electrode and a first electrode of the ninth transistor are connected with the first power supply terminal, and a second electrode of the ninth transistor is connected with a pull-down node;

a control electrode of the tenth transistor is connected with the pull-up node, a first electrode of the tenth transistor is connected with the pull-down node, and a second electrode of the tenth transistor is connected with the second power supply terminal;

a control electrode of the eleventh transistor is connected with the pull-down node, a first electrode of the eleventh transistor is connected with the pull-up node, and a second electrode of the eleventh transistor is connected with the second power supply terminal;

a control electrode of the twelfth transistor is connected with the pull-down node, a first electrode of the twelfth transistor is connected with the second output terminal, and a second electrode of the twelfth transistor is connected with the second power supply terminal; and a control electrode of the thirteenth transistor is connected with the pull-down node, a first electrode of the thirteenth transistor is connected with the first output terminal, and a second electrode of the thirteenth transistor is connected with the third power supply terminal.

In some possible implementations, the first reset sub-circuit comprises a fourteenth transistor;

a control electrode of the fourteenth transistor is connected with the first reset terminal, a first electrode of the fourteenth transistor is connected with the pull-up node, and a second electrode of the fourteenth transistor is connected with the second power supply terminal.

In some possible implementations, the second reset sub-circuit comprises a fifteenth transistor and a sixteenth transistor;

a control electrode of the fifteenth transistor is connected with the second reset terminal, a first electrode of the fifteenth transistor is connected with the sensing node, and a second electrode of the fifteenth transistor is connected with the pull-up node; and a control electrode of the sixteenth transistor is connected with the second reset terminal, a first electrode of the sixteenth transistor is connected with the pull-up node, and a second electrode of the sixteenth transistor is connected with the second power supply terminal.

In some possible implementations, the shift register further comprises: a second reset sub-circuit;

wherein the sensing control sub-circuit comprises a first transistor, a second transistor, a third transistor, a fourth transistor, a fifth transistor and a first capacitor; the input sub-circuit includes a sixth transistor; the output sub-circuit comprises a seventh transistor, an eighth transistor and a second capacitor; the pull-down sub-circuit comprises a ninth transistor, a tenth transistor, an eleventh transistor, a twelfth transistor and a thirteenth transistor; the first reset sub-circuit includes a fourteenth transistor; the second reset sub-circuit comprises a fifteenth transistor and a sixteenth transistor;

a control electrode and a first electrode of the first transistor are connected with the signal input terminal, and a second electrode of the first transistor is connected with the sensing node;

a control electrode of the second transistor is connected with the random sensing signal terminal, a first electrode of the second transistor is connected with the sensing node, and a second electrode of the second transistor is connected with a first electrode of the third transistor;

a control electrode of the third transistor is connected with the first reset terminal, and a second electrode of the third transistor is connected with the pull-up node;

a control electrode of the fourth transistor is connected with the sensing node, a first electrode of the fourth transistor is connected with the first clock signal terminal, and a second electrode of the fourth transistor is connected with a first electrode of the fifth transistor;

a control electrode of the fifth transistor is connected with the first clock signal terminal, and a second electrode of the fifth transistor is connected with the pull-up node;

a first terminal of the first capacitor is connected with the sensing node, and a second terminal of the first capacitor is connected with the second electrode of the fourth transistor.

a control electrode of the sixth transistor is connected with the signal input terminal, a first electrode of the sixth transistor is connected with the first power supply terminal, and a second electrode of the sixth transistor is connected with the pull-up node;

a control electrode of the seventh transistor is connected with the pull-up node, a first electrode of the seventh transistor is connected with the second clock signal terminal, and a second electrode of the seventh transistor is connected with the second output terminal;

a control electrode of the eighth transistor is connected with the pull-up node, a first electrode of the eighth transistor is connected with the third clock signal terminal, and a second electrode of the eighth transistor is connected with the first output terminal;

a first terminal of the second capacitor is connected with the pull-up node, and a second terminal of the second capacitor is connected with the first output terminal;

a control electrode and a first electrode of the ninth transistor are connected with the first power supply terminal, and a second electrode of the ninth transistor is connected with a pull-down node;

a control electrode of the tenth transistor is connected with the pull-up node, a first electrode of the tenth transistor is connected with the pull-down node, and a second electrode of the tenth transistor is connected with the second power supply terminal;

a control electrode of the eleventh transistor is connected with the pull-down node, a first electrode of the eleventh transistor is connected with the pull-up node, and a second electrode of the eleventh transistor is connected with the second power supply terminal;

a control electrode of the twelfth transistor is connected with the pull-down node, a first electrode of the twelfth transistor is connected with the second output terminal, and a second electrode of the twelfth transistor is connected with the second power supply terminal;

a control electrode of the thirteenth transistor is connected with the pull-down node, a first electrode of the thirteenth transistor is connected with the first output terminal, and a second electrode of the thirteenth transistor is connected with the third power supply terminal;

a control electrode of the fourteenth transistor is connected with the first reset terminal, a first electrode of the fourteenth transistor is connected with the pull-up node, and a second electrode of the fourteenth transistor is connected with the second power supply terminal;

a control electrode of the fifteenth transistor is connected with the second reset terminal, a first electrode of the fifteenth transistor is connected with the sensing node, and a second electrode of the fifteenth transistor is connected with the pull-up node; and a control electrode of the sixteenth transistor is connected with the second reset terminal, a first electrode of the sixteenth transistor is connected with the pull-up node, and a second electrode of the sixteenth transistor is connected with the second power supply terminal.

In a second aspect, the present disclosure provides a gate driving circuit, comprising a plurality of shift registers described above;

a first stage shift register has a signal input terminal connected with an initial signal terminal, a second stage shift register has a signal input terminal connected with the initial signal terminal, a (N+2)th stage shift register has a signal input terminal connected with a second output terminal of a Nth stage shift register, and the Nth stage shift register has a first reset terminal connected with a second output terminal of the (N+3)th stage shift register, N1≥1.

In some possible implementations, wherein the gate driving circuit comprises a first clock terminal, a second clock terminal, a third clock terminal, a fourth clock terminal, a fifth clock terminal, a sixth clock terminal, a seventh clock terminal and an eighth clock terminal;

a (4i+1)th stage shift register has a second clock signal terminal connected with the first clock terminal, the (4i+1)th stage shift register has a third clock signal terminal connected with the fifth clock terminal, a (4i+2)th stage shift register has a second clock signal terminal connected with the second clock terminal, the (4i+2)th stage shift register has a third clock signal terminal connected with the sixth clock terminal, a (4i+3)th stage shift register has a second clock signal terminal connected with the third clock terminal, the (4i+3)th stage shift register has a third clock signal terminal connected with the seventh clock terminal, a (4i+4)th stage shift register has a second clock signal terminal connected with the fourth clock terminal, and the (4i+4)th stage shift register has a third clock signal terminal connected with the eighth clock terminal.

In a third aspect, the present disclosure provides a driving method for a shift register, which is applied to the shift register described above, wherein the shift register is disposed in a display panel, and the display panel comprises a display stage and a sensing stage, and the method comprises:

in the display stage, providing the signal of the first power supply terminal to the pull-up node by the input sub-circuit under control of the signal input terminal; providing the signal of the third clock signal terminal to the first output terminal and providing the signal of the second clock signal terminal to the second output terminal by the output sub-circuit under control of the pull-up node; providing the signal of the second power supply terminal to the pull-up node by the first reset sub-circuit under control of the first reset terminal; providing the signal of the second power supply terminal to the pull-up node and the second output terminal and providing the signal of the third power supply terminal to the first output terminal by the pull-down sub-circuit under control of the first power supply terminal and the pull-up node; and in the sensing stage, providing the signal of the first clock signal terminal to the pull-up node by the sensing control sub-circuit under control of the signal input terminal, the random sensing signal terminal, the first clock signal terminal and the first reset terminal, and providing the signal of the third clock signal terminal to the first output terminal by the output sub-circuit under control of the pull-up node.

In some possible implementations, the method further comprises: in the sensing stage, providing the signal of the second power supply terminal to the pull-up node and the sensing node by the second reset sub-circuit under control of the second reset terminal.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain technical solutions of the present disclosure and do not constitute a limitation on the technical solutions of the present disclosure.

DETAILED DESCRIPTION

Figure 1:
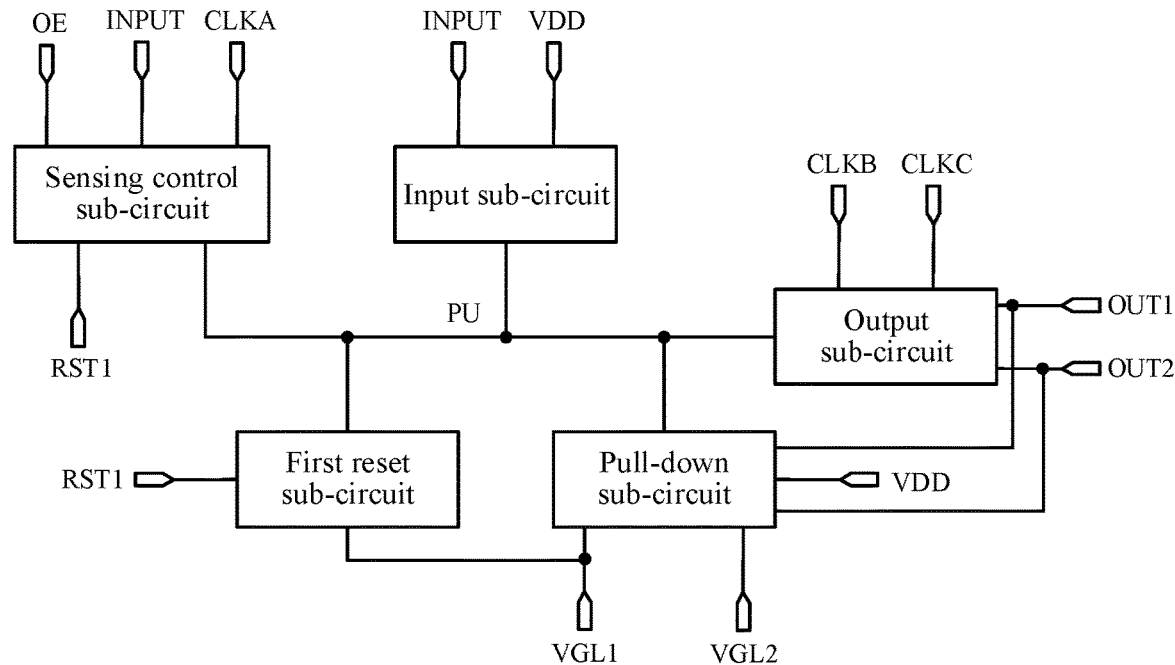
FIG. 1 is a schematic structural diagram of a shift register according to an embodiment of the present disclosure.

Multiple embodiments are described in the present disclosure, but the description is exemplary rather than limiting, and for those of ordinary skills in the art, there may be more embodiments and implementation solutions within the scope of the embodiments described in the present disclosure. Although many possible combinations of features are shown in the drawings and discussed in the detailed description, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skilled in the art. The disclosed embodiments, features and elements of the present disclosure may be combined with any regular features or elements to form a technical solution defined by the claims. Any feature or element of any embodiment may also be combined with features or elements from other technical solutions to form another technical solution defined by the claims. Therefore, it should be understood that any of the features shown and discussed in the present disclosure may be implemented individually or in any suitable combination. Therefore, the embodiments are not otherwise limited except in accordance with the appended claims and equivalents thereof. In addition, various modifications and changes can be made within the protection scope of the appended claims.

Unless otherwise defined, technical terms or scientific terms used in the present disclosure shall have ordinary meanings understood by those of ordinary skills in the field to which the present disclosure belongs. The words "first", "second" and the like used in the present disclosure do not indicate any order, quantity or importance, but are only used to distinguish different components. Similar words such as "including" or "containing" mean that elements or articles appearing before the word cover elements or articles listed after the word and their equivalents, without excluding other elements or articles. Similar words such as "connect" or "link" are not limited to physical or mechanical connections, but may include electrical connections, whether direct or indirect.

Transistors used in all embodiments of the present disclosure may be thin film transistors or field effect tubes or other devices with same characteristics. The thin film transistor may be an oxide semiconductor transistor. Since a source and a drain of a transistor used here are symmetrical, the source and the drain may be interchanged. In the embodiment of the present disclosure, the gate of the transistor is taken as a control electrode. In the present disclosure, to distinguish two electrodes of the transistor except the gate, one of the electrodes is referred to as a first electrode and the other electrode is referred to as a second electrode. The first electrode may be a source or a drain, and the second electrode may be a drain or a source.

Usually, an output of a shift register is relatively simple, which can't achieve multiple pulse outputs, so that the shift register can't output scanning signals in a non-display stage, which leads to the inability to detect pixel circuits and affects the display effect.

FIG. 1 is a schematic structural diagram of a shift register according to an embodiment of the present disclosure. As shown in FIG. 1, the shift register provided by the embodiment of the present disclosure includes an input sub-circuit, a sensing control sub-circuit, an output sub-circuit, a first reset sub-circuit and a pull-down sub-circuit.

The input sub-circuit is connected with a signal input terminal INPUT, a first power supply terminal VDD and a pull-up node PU respectively, and is configured to provide a signal of the first power supply terminal VDD to the pull-up node PU under control of the signal input terminal INPUT. The sensing control sub-circuit is connected with a random sensing signal terminal OE, the signal input terminal INPUT, a first clock signal terminal CLKA, a first reset terminal RST1 and the pull-up node PU respectively, and is configured to provide a signal of first clock signal terminal CLKA to the pull-up node PU under control of the signal input terminal INPUT, the random sensing signal terminal OE, the first clock signal terminal CLKA and the first reset terminal RST1. The first reset sub-circuit is connected with the first reset terminal RST1, the pull-up node PU and a second power supply terminal VGL1 respectively, and is configured to provide a signal of the second power supply terminal VGL1 to the pull-up node PU under control of the first reset terminal RST1. The output sub-circuit is connected with a second clock signal terminal CLKB, a third clock signal terminal CLKC, the pull-up node PU, a first output terminal OUT1 and a second output terminal OUT2 respectively, and is configured to provide a signal of the third clock signal terminal CLKC to the first output terminal OUT1 and a signal of the second clock signal terminal CLKB to the second output terminal OUT2 under control of the pull-up node PU. The pull-down sub-circuit is connected with the first power supply terminal VDD, the second power supply terminal VGL1, a third power supply terminal VGL2, the pull-up node PU, the first output terminal OUT1 and the second output terminal OUT2 respectively, and is configured to provide the signal of the second power supply terminal VGL1 to the pull-up node PU and the second output terminal OUT2, and a signal of the third power supply terminal VGL2 to the first output terminal OUT1 under control of the first power supply terminal VDD and the pull-up node PU.

In an exemplary embodiment, the first power supply terminal VDD continuously provides a high level signal.

In an exemplary embodiment, the second power supply terminal VGL1 and the third power supply terminal VGL2 continuously provide low-level signals. The signal potentials of the second power supply terminal VGL1 and the third power supply terminal VGL2 may be the same or may be different. When the potentials of the second power supply terminal VGL1 and the third power supply terminal VGL2 are different, a signal potential of the third power supply terminal VGL2 is higher than that of the second power supply terminal VGL1.

In an exemplary embodiment, the first output terminal may be configured to output a current stage driving signal, and the second output terminal may be configured to output a cascade signal.

In an exemplary embodiment, the shift register is disposed in a display panel. The display panel includes a display stage and a sensing stage, the sensing stage is a period of a non-display stage. The sensing control sub-circuit provided in this embodiment cannot affect a potential of the pull-up node in the display stage, and the signal input terminal INPUT in the input sub-circuit provides a signal to the pull-up node PU, a signal of the first clock signal terminal CLKA is provided to the pull-up node PU in the sensing stage, so that the shift register can output a scanning signal in the sensing stage.

In an exemplary embodiment, the clock signals of the second clock signal terminal CLKB and the third clock signal terminal CLKC are the same in the display stage.

In an exemplary embodiment, a pulse width relationship of the signals of the first clock signal terminal CLKA, the second clock signal terminal CLKB and the third clock signal terminal CLKC can be adjusted.

In an exemplary embodiment, a signal of the random sensing signal terminal OE is a random signal generated by an external circuit such as a field programmable gate array. With different signals of random sensing signal terminal OE, the pixel circuits to be detected are different, that is, the shift registers that can achieve multiple pulse outputs are also different.

The shift register provided by the embodiment of the present disclosure comprises an input sub-circuit, a sensing control sub-circuit, an output sub-circuit, a first reset sub-circuit and a pull-down sub-circuit; the input sub-circuit is connected with a signal input terminal, a first power supply terminal and a pull-up node respectively, and is configured to provide a signal of the first power supply terminal to the pull-up node under control of the signal input terminal; the sensing control sub-circuit is connected with a random sensing signal terminal, the signal input terminal, a first clock signal terminal, a first reset terminal and a pull-up node respectively, and is configured to provide a signal of the first clock signal terminal to the pull-up node under control of the signal input terminal, the random sensing signal terminal, the first clock signal terminal and the first reset terminal; the first reset sub-circuit is connected with the first reset terminal, the pull-up node and a second power supply terminal respectively, and is configured to provide a signal of the second power supply terminal to the pull-up node with under control of the first reset terminal; the output sub-circuit is connected with a second clock signal terminal, a third clock signal terminal, the pull-up node, a first output terminal and a second output terminal respectively, and is configured to provide a signal of the third clock signal terminal to the first output terminal and provide a signal of the second clock signal terminal to the second output terminal under control of the pull-up node; the pull-down sub-circuit is connected with the first power supply terminal, the second power supply terminal, a third power supply terminal, the pull-up node, the first output terminal and the second output terminal respectively, and is configured to provide a signal of the second power supply terminal to the pull-up node and the second output terminal and provide a signal of the third power supply terminal to the first output terminal under control of the first power supply terminal and the pull-up node. According to the technical scheme provided by the embodiment of the present disclosure, the shift register can achieve multi-pulse output by setting the sensing control sub-circuit, so that the pixel circuit can be detected, and the display effect is improved.

Figure 2:
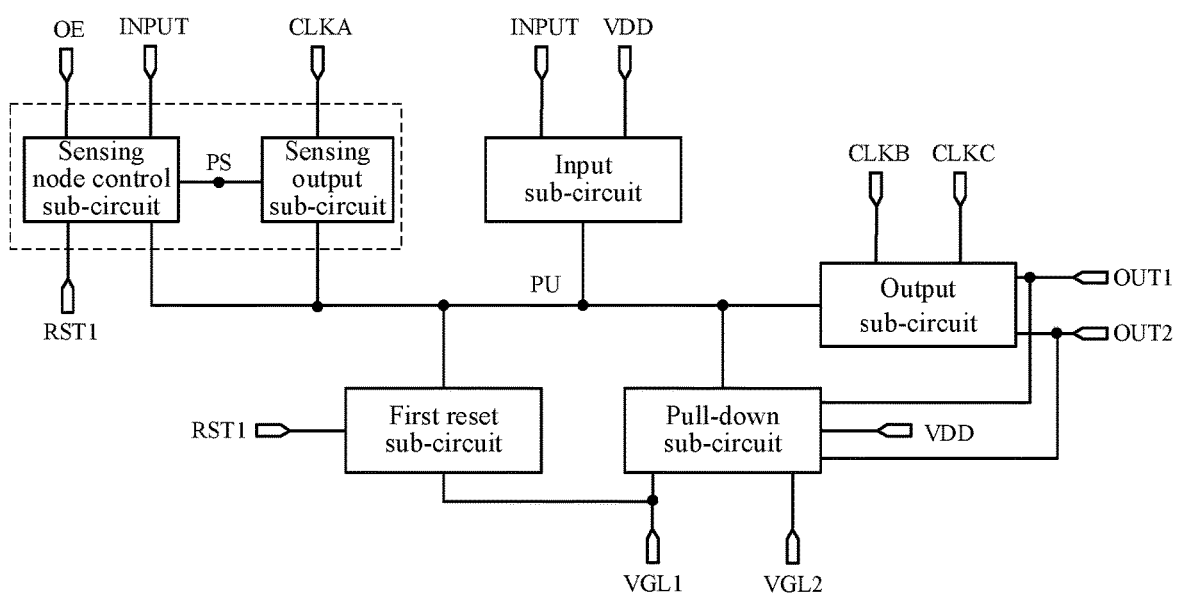
FIG. 2 is a schematic structural diagram of a shift register according to an exemplary embodiment.

FIG. 2 is a schematic structural diagram of a shift register according to an exemplary embodiment. As shown in FIG. 2, a sensing control sub-circuit in the shift register provided by the exemplary embodiment includes a sensing node control sub-circuit and a sensing output sub-circuit.

The sensing node control sub-circuit is connected with a signal input terminal INPUT, a sensing node PS, a random sensing signal terminal OE, a pull-up node PU and a first reset terminal RST1, and is configured to provide a signal of the signal input terminal INPUT or a signal of the pull-up node PU to the sensing node PS under control of the signal input terminal INPUT, the random sensing signal terminal OE and the first reset terminal RST1. The sensing output sub-circuit is connected with the sensing node PS, the first clock signal terminal CLKA and the pull-up node PU, and is configured to provide a signal of the first clock signal terminal CLKA to the pull-up node PU under control of the first clock signal terminal CLKA and the sensing node PS.

Figure 3:
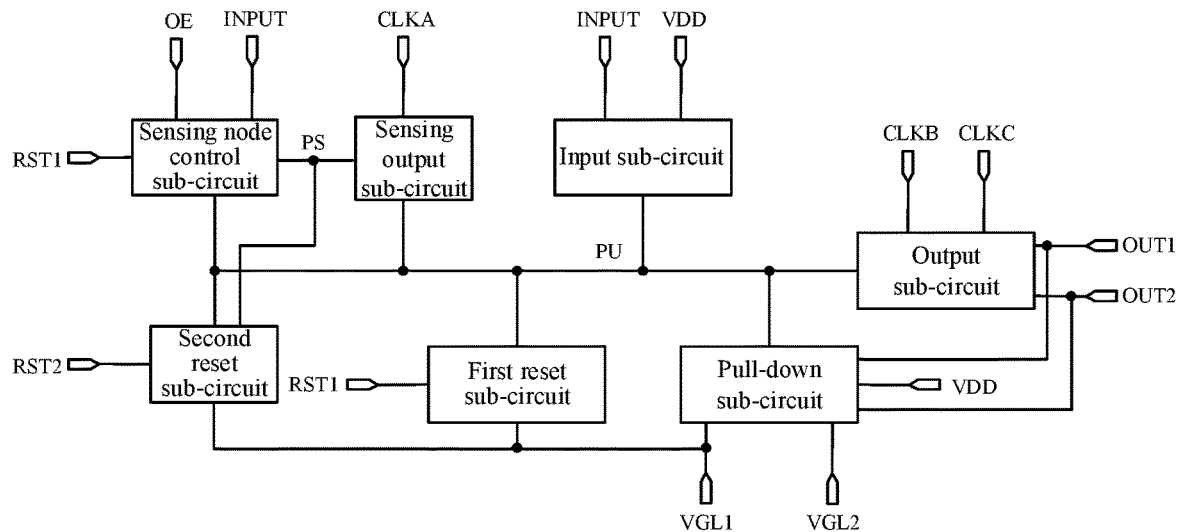
FIG. 3 is a schematic structural diagram of a shift register according to another exemplary embodiment.

FIG. 3 is a schematic structural diagram of a shift register according to an exemplary embodiment. As shown in FIG. 3, the shift register provided by the exemplary embodiment further includes a second reset sub-circuit.

The second reset sub-circuit is connected with a second reset terminal RST2, a pull-up node PU, a sensing node PS and a second power supply terminal VGL1 respectively, and is configured to provide a signal of the second power supply terminal VGL1 to the pull-up node PU and the sensing node PS under control of the second reset terminal RST2.

Figure 4:
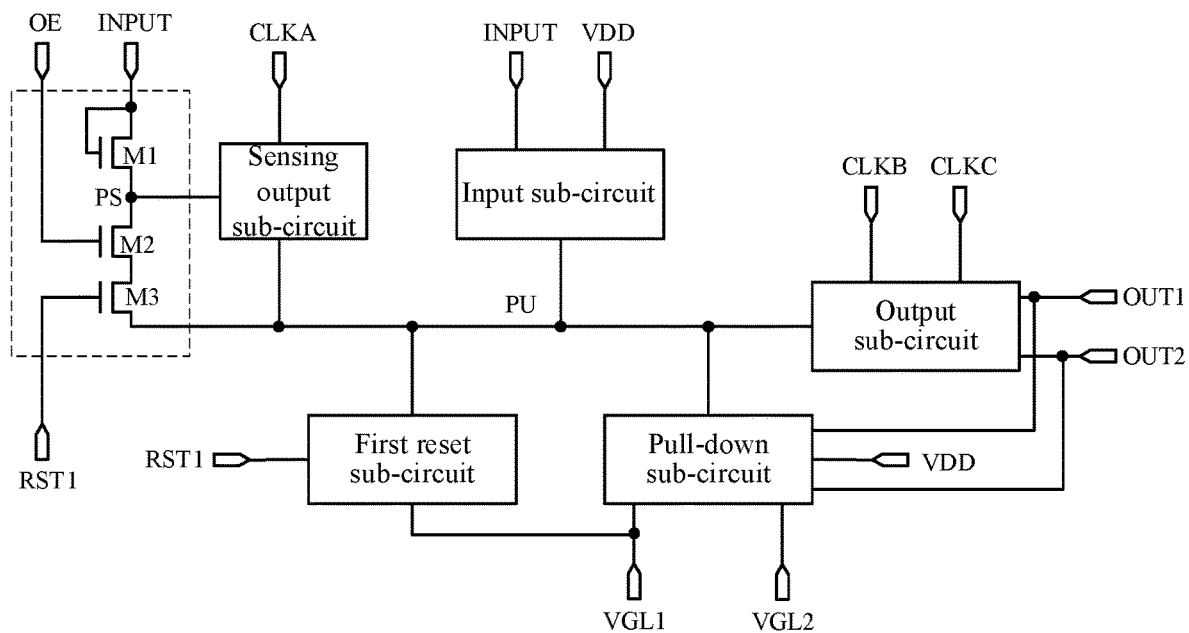
FIG. 4 is an equivalent circuit diagram of a sensing node control sub-circuit according to an exemplary embodiment.

FIG. 4 is an equivalent circuit diagram of a sensing node control sub-circuit according to an exemplary embodiment. As shown in FIG. 4, the sensing node control sub-circuit provided by the exemplary embodiment includes a first transistor M1, a second transistor M2 and a third transistor M3.

A control electrode and a first electrode of the first transistor M1 are connected with the signal input terminal INPUT, and a second electrode of the first transistor M1 is connected with the sensing node PS. A control electrode of the second transistor M2 is connected with the random sensing signal terminal OE, a first electrode of the second transistor M2 is connected with the sensing node PS, and a second electrode of the second transistor M2 is connected with a first electrode of the third transistor M3. A control electrode of the third transistor M3 is connected with the first reset terminal RST1, and a second electrode of the third transistor M3 is connected with the pull-up node PULL.

An exemplary structure of the sensing node control sub-circuit is shown in FIG. 4. The implementation of the sensing node control sub-circuit is not limited to this.

Figure 5:
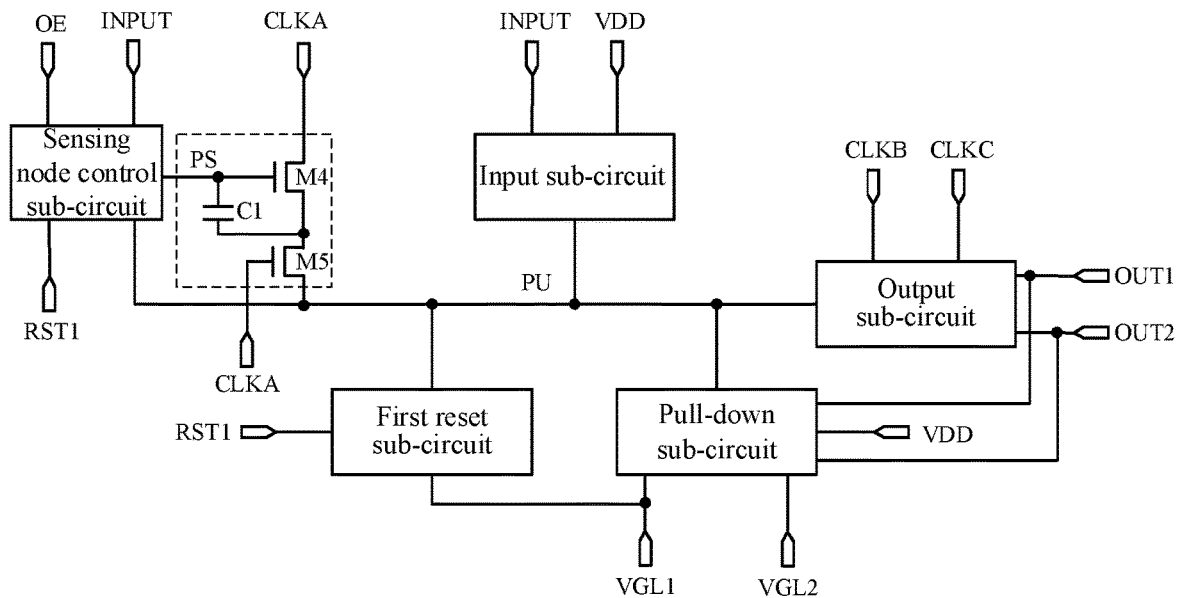
FIG. 5 is an equivalent circuit diagram of a sensing output sub-circuit according to an exemplary embodiment.

FIG. 5 is an equivalent circuit diagram of a sensing output sub-circuit according to an exemplary embodiment. As shown in FIG. 5, the sensing output sub-circuit provided by the exemplary embodiment includes a fourth transistor M4, a fifth transistor M5 and a first capacitor C1.

A control electrode of the fourth transistor M4 is connected with a sensing node PS, a first electrode of the fourth transistor M4 is connected with a first clock signal terminal CLKA, and a second electrode of the fourth transistor M4 is connected with a first electrode of the fifth transistor M5. A control electrode of the fifth transistor M5 is connected with a first clock signal terminal CLKA, and a second electrode of the fifth transistor M5 is connected with a pull-up node PU. A first terminal of the first capacitor C1 is connected with the sensing node PS, and a second terminal of the first capacitor C1 is connected with the second electrode of the fourth transistor M4.

An exemplary structure of the sensing output sub-circuit is shown in FIG. 5. The implementation of the sensing output sub-circuit is not limited to this.

Figure 6:
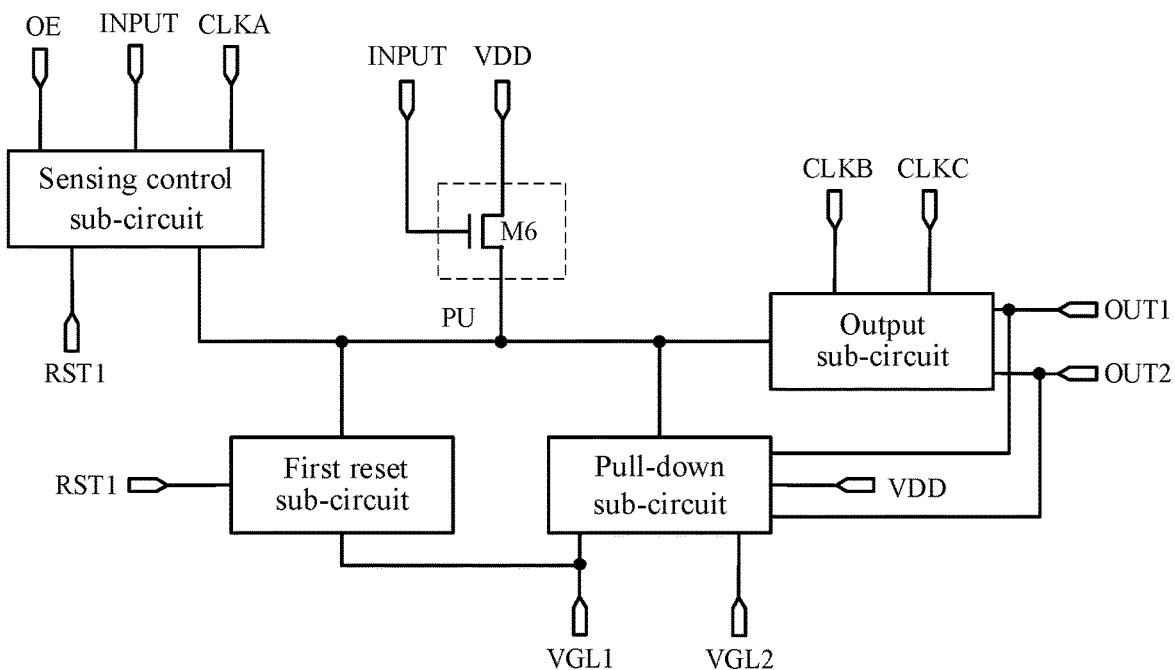
FIG. 6 is an equivalent circuit diagram of an input sub-circuit according to an exemplary embodiment.

FIG. 6 is an equivalent circuit diagram of an input sub-circuit according to an exemplary embodiment. As shown in FIG. 6, the input sub-circuit provided by the exemplary embodiment includes: a sixth transistor M6.

A control electrode of the sixth transistor M6 is connected with a signal input terminal INPUT, a first electrode of the sixth transistor M6 is connected with a first power supply terminal VDD, and a second electrode of the sixth transistor M6 is connected with a pull-up node PU.

An exemplary structure of the input sub-circuit is shown in FIG. 6. The implementation of the input sub-circuit is not limited to this.

Figure 7:
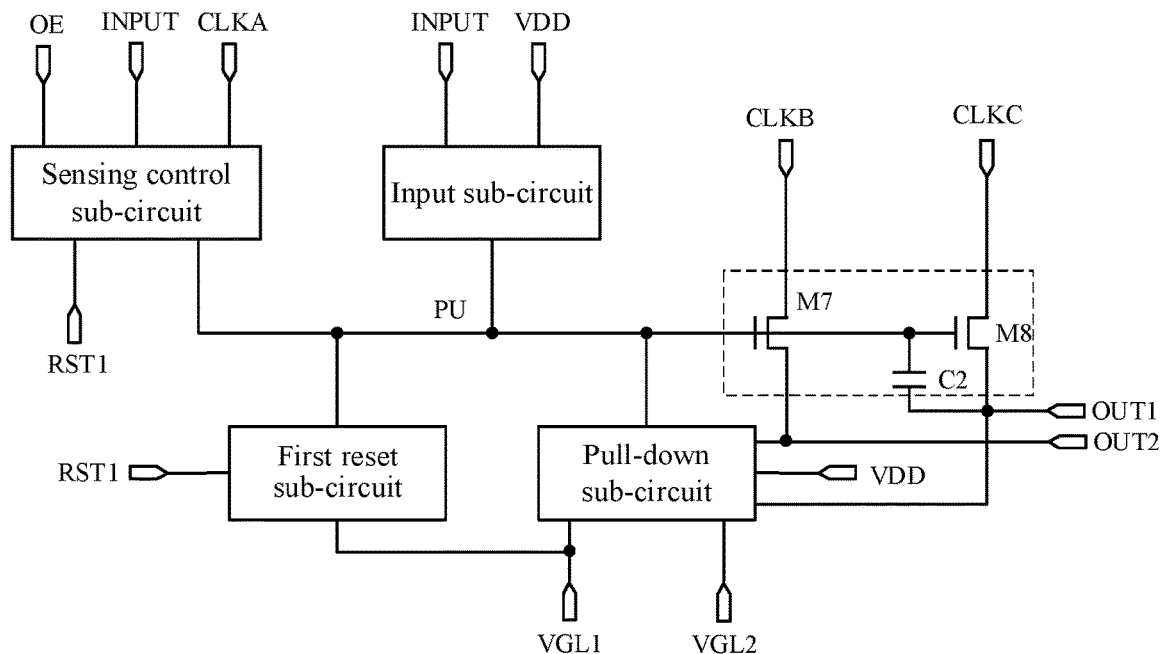
FIG. 7 is an equivalent circuit diagram of an output sub-circuit according to an exemplary embodiment.

FIG. 7 is an equivalent circuit diagram of an output sub-circuit according to an exemplary embodiment. As shown in FIG. 7, the output sub-circuit provided by the exemplary embodiment includes: a seventh transistor M7, an eighth transistor M8 and a second capacitor C2.

A control electrode of the seventh transistor M7 is connected with a pull-up node PU, a first electrode of the seventh transistor M7 is connected with a second clock signal terminal CLKB, and a second electrode of the seventh transistor M7 is connected with a second output terminal OUT2. A control electrode of the eighth transistor M8 is connected with the pull-up node PU, a first electrode of the eighth transistor M8 is connected with a third clock signal terminal CLKC, and a second electrode of the eighth transistor M8 is connected with a first output terminal OUT1. A first terminal of the second capacitor C2 is connected with the pull-up node PU, and a second terminal of the second capacitor C2 is connected with the first output terminal OUT1.

An exemplary structure of the output sub-circuit is shown in FIG. 7. The implementation of the output sub-circuit is not limited to this.

Figure 8:
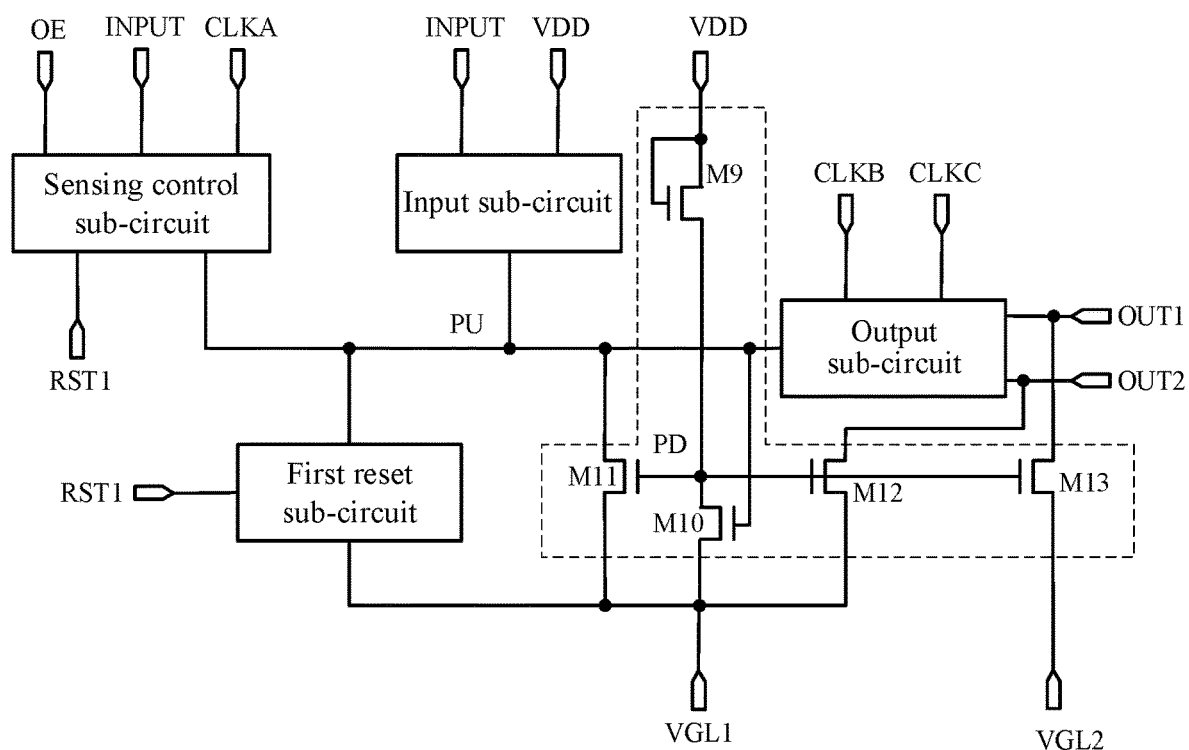
FIG. 8 is an equivalent circuit diagram of a pull-down sub-circuit according to an exemplary embodiment.

FIG. 8 is an equivalent circuit diagram of a pull-down sub-circuit according to an exemplary embodiment. As shown in FIG. 8, the pull-down sub-circuit provided by the exemplary embodiment includes a ninth transistor M9, a tenth transistor M10, an eleventh transistor M11, a twelfth transistor M12 and a thirteenth transistor M13.

A control electrode and a first electrode of the ninth transistor M9 are connected with a first power supply terminal VDD, and a second electrode of the ninth transistor M9 is connected with a pull-down node PD. A control electrode of the tenth transistor M10 is connected with a pull-up node PU, a first electrode of the tenth transistor M10 is connected with the pull-down node PD, and a second electrode of the tenth transistor M10 is connected with a second power supply terminal VGL1. A control electrode of the eleventh transistor M11 is connected with the pull-down node PD, a first electrode of the eleventh transistor M11 is connected with the pull-up node PU, and a second electrode of the eleventh transistor M11 is connected with the second power supply terminal VGL1. A control electrode of the twelfth transistor M12 is connected with the pull-down node PD, a first electrode of the twelfth transistor M12 is connected with a second output terminal OUT2, and a second electrode of the twelfth transistor M12 is connected with the second power supply terminal VGL1. A control electrode of the thirteenth transistor M13 is connected with the pull-down node PD, a first electrode of the thirteenth transistor M13 is connected with a first output terminal OUT1, and a second electrode of the thirteenth transistor M13 is connected with a third power supply terminal VGL2.

An exemplary structure of the pull-down sub-circuit is shown in FIG. 8. The implementation of the pull-down sub-circuit is not limited to this.

Figure 9:
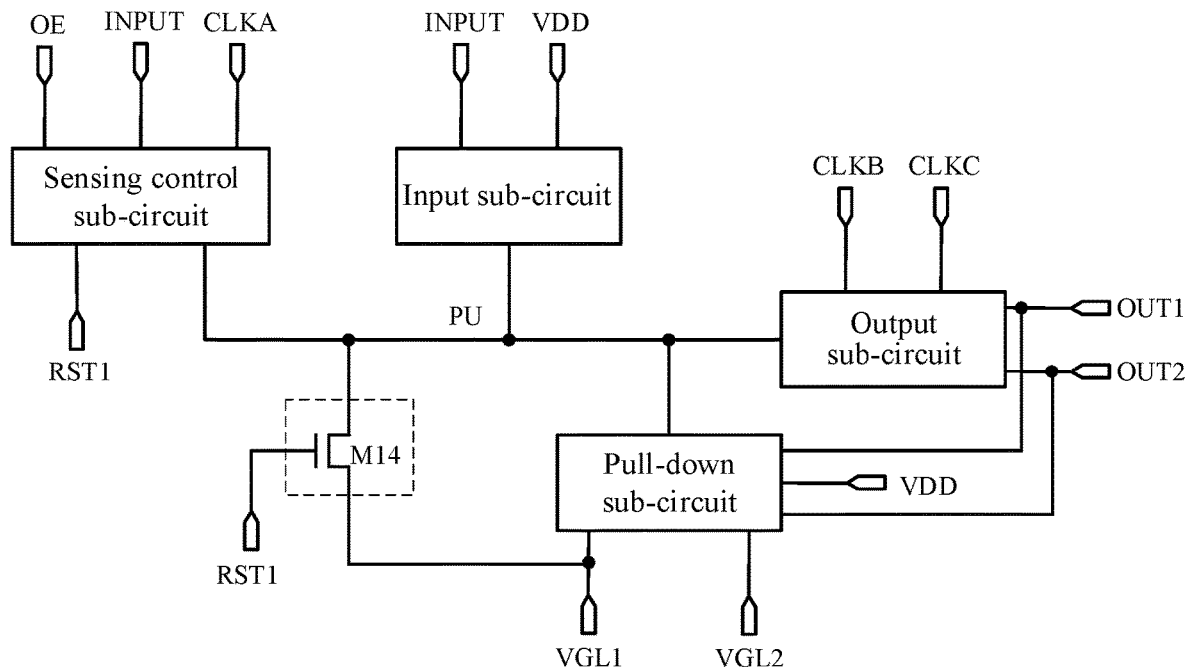
FIG. 9 is an equivalent circuit diagram of a first reset sub-circuit according to an exemplary embodiment.

FIG. 9 is an equivalent circuit diagram of a first reset sub-circuit according to an exemplary embodiment. As shown in FIG. 9, a first reset sub-circuit provided by an exemplary embodiment includes a fourteenth transistor M14.

A control electrode of the fourteenth transistor M14 is connected with a first reset terminal RST1, a first electrode of the fourteenth transistor M14 is connected with a pull-up node PU, and a second electrode of the fourteenth transistor M14 is connected with a second power supply terminal VGL1.

An exemplary structure of the first reset sub-circuit is shown in FIG. 9. The implementation of the first reset sub-circuit is not limited to this.

Figure 10:
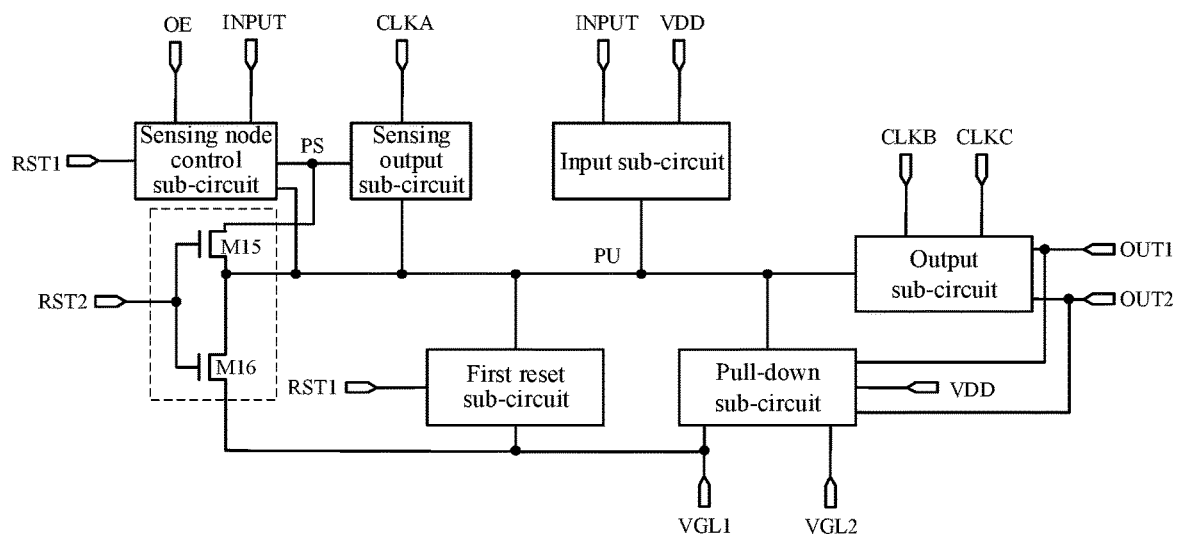
FIG. 10 is an equivalent circuit diagram of a second reset sub-circuit according to an exemplary embodiment.

FIG. 10 is an equivalent circuit diagram of a second reset sub-circuit according to an exemplary embodiment. As shown in FIG. 10, the second reset sub-circuit provided by the exemplary embodiment includes a fifteenth transistor M15 and a sixteenth transistor M16.

A control electrode of the fifteenth transistor M15 is connected with a second reset terminal RST2, a first electrode of the fifteenth transistor M15 is connected with a sensing node PS, and a second electrode of the fifteenth transistor M15 is connected with a pull-up node PU. A control electrode of the sixteenth transistor M16 is connected with the second reset terminal RST2, a first electrode of the sixteenth transistor M16 is connected with the pull-up node PU, and a second electrode of the sixteenth transistor M16 is connected with A second power supply terminal VGL1.

An exemplary structure of the second reset sub-circuit is shown in FIG. 10. The implementation of the second reset sub-circuit is not limited to this.

Figure 11:
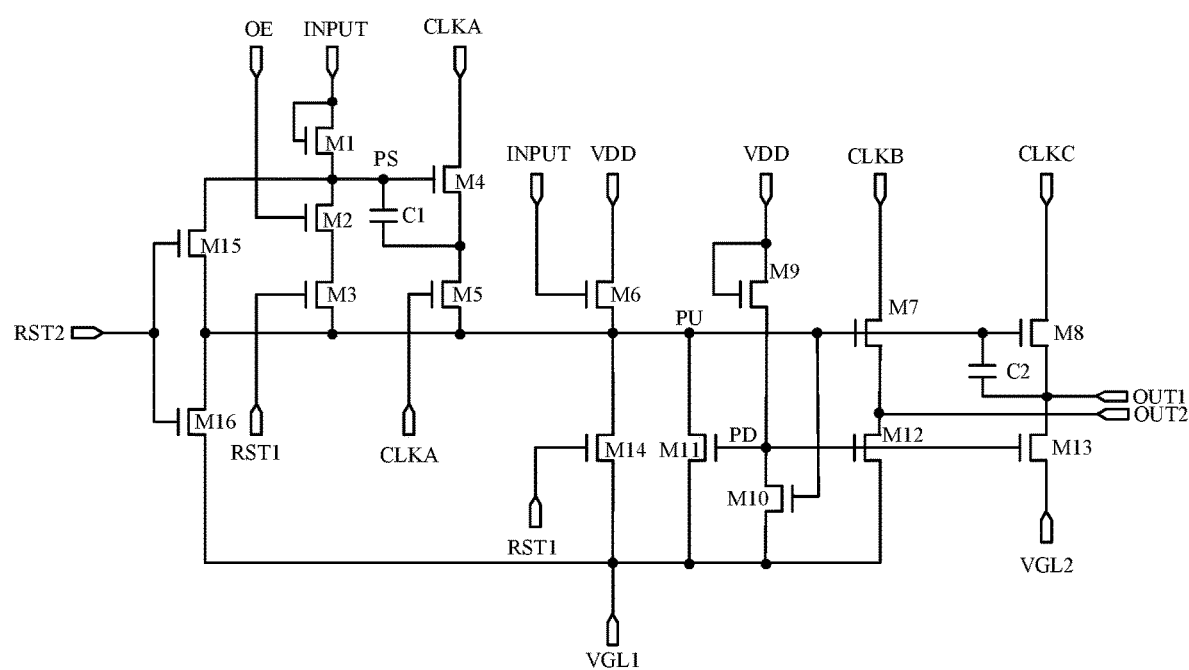
FIG. 11 is an equivalent circuit diagram of a shift register according to an exemplary embodiment.

FIG. 11 is an equivalent circuit diagram of a shift register according to an exemplary embodiment. As shown in FIG. 11, the shift register provided by the exemplary embodiment may further include a second reset sub-circuit. A sensing control sub-circuit includes a first transistor M1, a second transistor M2, a third transistor M3, a fourth transistor M4, a fifth transistor M5 and a first capacitor C1. An input sub-circuit includes a sixth transistor M6. An output sub-circuit includes a seventh transistor M7, an eighth transistor M8 and a second capacitor C2. A pull-down sub-circuit includes a ninth transistor M9, a tenth transistor M10, an eleventh transistor M11, a twelfth transistor M12 and a thirteenth transistor M13. A first reset sub-circuit includes a fourteenth transistor M14. The second reset sub-circuit includes a fifteenth transistor M15 and a sixteenth transistor M16.

A control electrode and a first electrode of the first transistor M1 are connected with a signal input terminal INPUT, and a second electrode of the first transistor M1 is connected with a sensing node PS. A control electrode of the second transistor M2 is connected with a random sensing signal terminal OE, a first electrode of the second transistor M2 is connected with the sensing node PS, and a second electrode of the second transistor M2 is connected with a first electrode of the third transistor M3. A control electrode of the third transistor M3 is connected with a first reset terminal RST1, and a second electrode of the third transistor M3 is connected with a pull-up node PU. A control electrode of the fourth transistor M4 is connected with the sensing node PS, a first electrode of the fourth transistor M4 is connected with a first clock signal terminal CLKA, and a second electrode of the fourth transistor M4 is connected with a first electrode of the fifth transistor M5. A control electrode of the fifth transistor M5 is connected with the first clock signal terminal CLKA, and a second electrode of the fifth transistor M5 is connected with the pull-up node PU.

The first terminal of the first capacitor C1 is connected with the sensing node PS, and the second terminal of the first capacitor C1 is connected with the second electrode of the fourth transistor M4. A control electrode of the sixth transistor M6 is connected with the signal input terminal INPUT, a first electrode of the sixth transistor M6 is connected with a first power supply terminal VDD, and a second electrode of the sixth transistor M6 is connected with the pull-up node PU. A control electrode of the seventh transistor M7 is connected with the pull-up node PU, a first electrode of the seventh transistor M7 is connected with a second clock signal terminal CLKB, and a second electrode of the seventh transistor M7 is connected with a second output terminal OUT2. A control electrode of the eighth transistor M8 is connected with the pull-up node PU, a first electrode of the eighth transistor M8 is connected with a third clock signal terminal CLKC, and a second electrode of the eighth transistor M8 is connected with a first output terminal OUT1. A first terminal of the second capacitor C2 is connected with the pull-up node PU, and a second terminal of the second capacitor C2 is connected with the first output terminal OUT1. A control electrode and a first electrode of the ninth transistor M9 are connected with the first power supply terminal VDD, and a second electrode of the ninth transistor M9 is connected with a pull-down node PD. A control electrode of the tenth transistor M10 is connected with the pull-up node PU, a first electrode of the tenth transistor M10 is connected with the pull-down node PD, and a second electrode of the tenth transistor M10 is connected with the second power supply terminal VGL1. A control electrode of the eleventh transistor M11 is connected with the pull-down node PD, a first electrode of the eleventh transistor M11 is connected with the pull-up node PU, and a second electrode of the eleventh transistor M11 is connected with the second power supply terminal VGL1. A control electrode of the twelfth transistor M12 is connected with the pull-down node PD, a first electrode of the twelfth transistor M12 is connected with the second output terminal OUT2, and a second electrode of the twelfth transistor M12 is connected with the second power supply terminal VGL1. A control electrode of the thirteenth transistor M13 is connected with the pull-down node PD, a first electrode of the thirteenth transistor M13 is connected with the first output terminal OUT1, and a second electrode of the thirteenth transistor M13 is connected with a third power supply terminal VGL2. A control electrode of the fourteenth transistor M14 is connected with the first reset terminal RST1, a first electrode of the fourteenth transistor M14 is connected with the pull-up node PU, and a second electrode of the fourteenth transistor M14 is connected with the second power supply terminal VGL1. A control electrode of the fifteenth transistor M15 is connected with a second reset terminal RST2, a first electrode of the fifteenth transistor M15 is connected with the sensing node PS, and a second electrode of the fifteenth transistor M15 is connected with the pull-up node PU. A control electrode of the sixteenth transistor M16 is connected with the second reset terminal RST2, a first electrode of the sixteenth transistor M16 is connected with the pull-up node PU, and a second electrode of the sixteenth transistor M16 is connected with the second power supply terminal VGL1.

In an exemplary embodiment, the first transistor M1 through the sixteenth transistor M16 may be N-type thin film transistors, or may be P-type thin film transistors. When the transistor types of transistors M1 through M16 are the same, the process flow can be unified, the number of the processes can be reduced, and the yield of products can be improved.

In an exemplary embodiment, all transistors may be low temperature polysilicon thin film transistors. All transistors are low temperature polysilicon thin film transistors, which can reduce the leakage current in the shift register.

In an exemplary embodiment, the thin film transistor can be a thin film transistor with a bottom gate structure or a thin film transistor with a top gate structure.

In an exemplary embodiment, the first capacitor C1 and the second capacitor C2 may be parasitic capacitors of transistors or may be external capacitors.

A shift register provided by an exemplary embodiment is illustrated below through an operating procedure of a shift register.

Figure 12A:
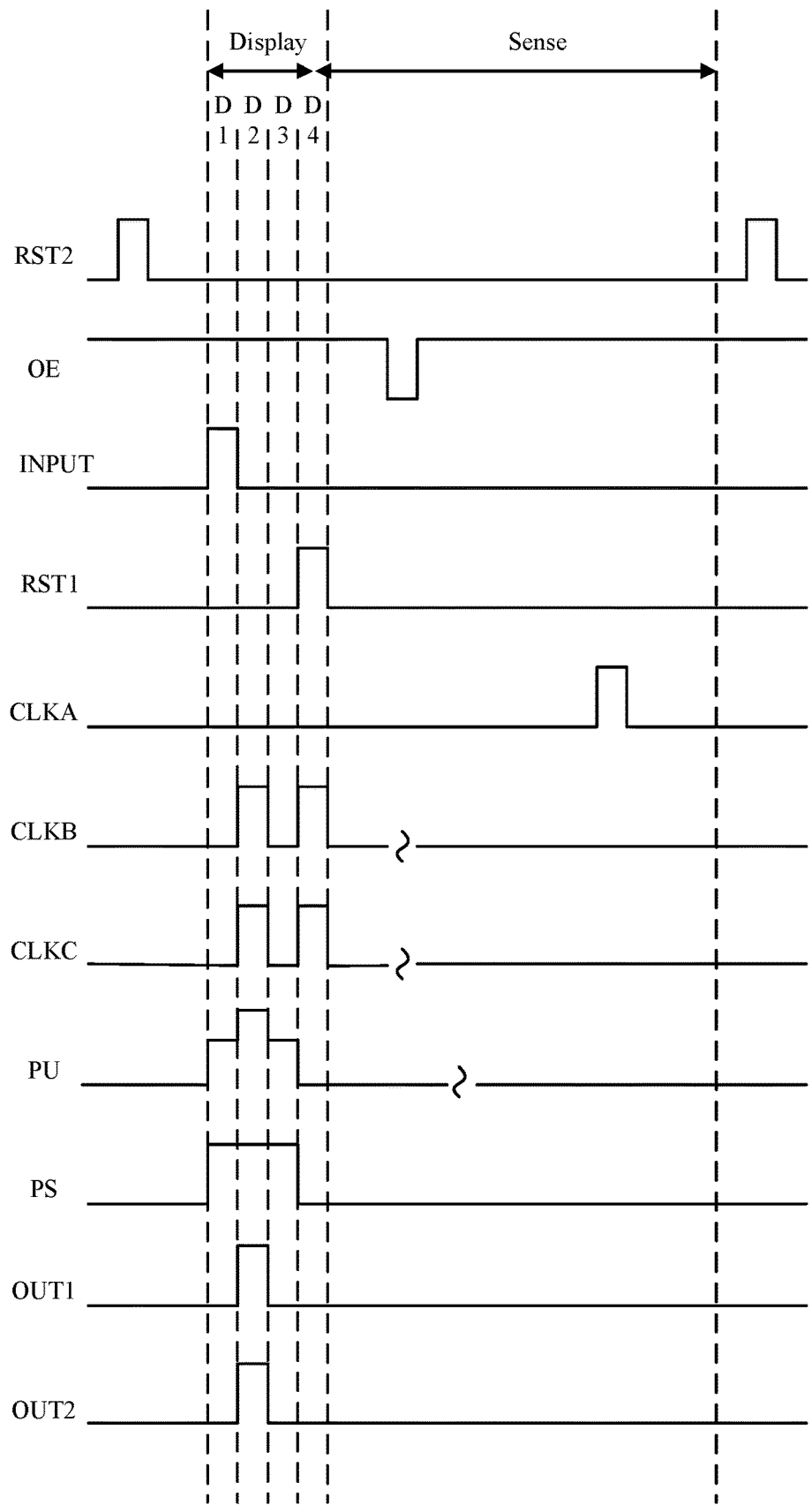
FIG. 12A is an operating timing diagram 1 of a shift register according to an exemplary embodiment.
Figure 12B:
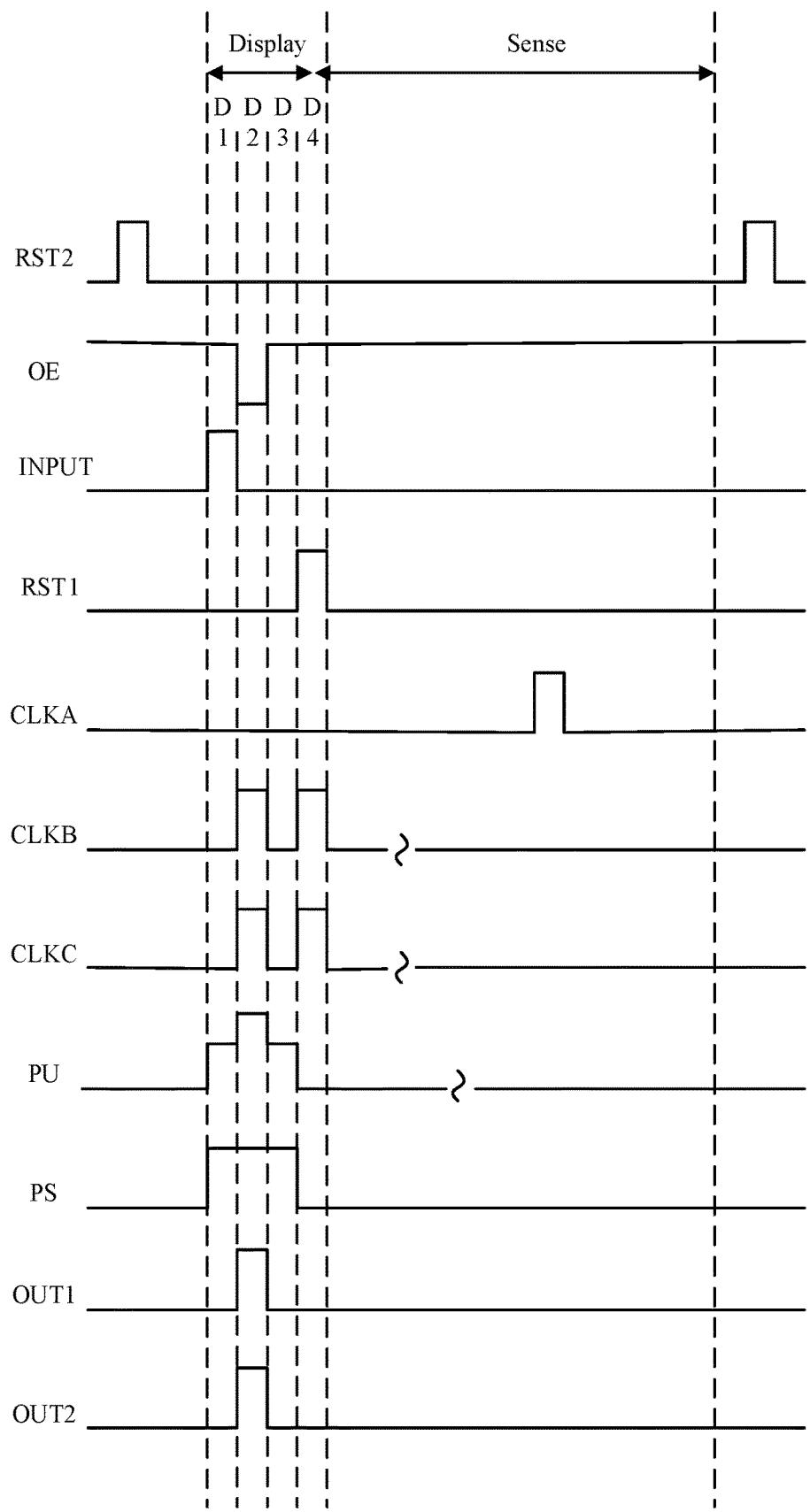
FIG. 12B is an operating timing diagram 2 of a shift register according to an exemplary embodiment.
Figure 12C:
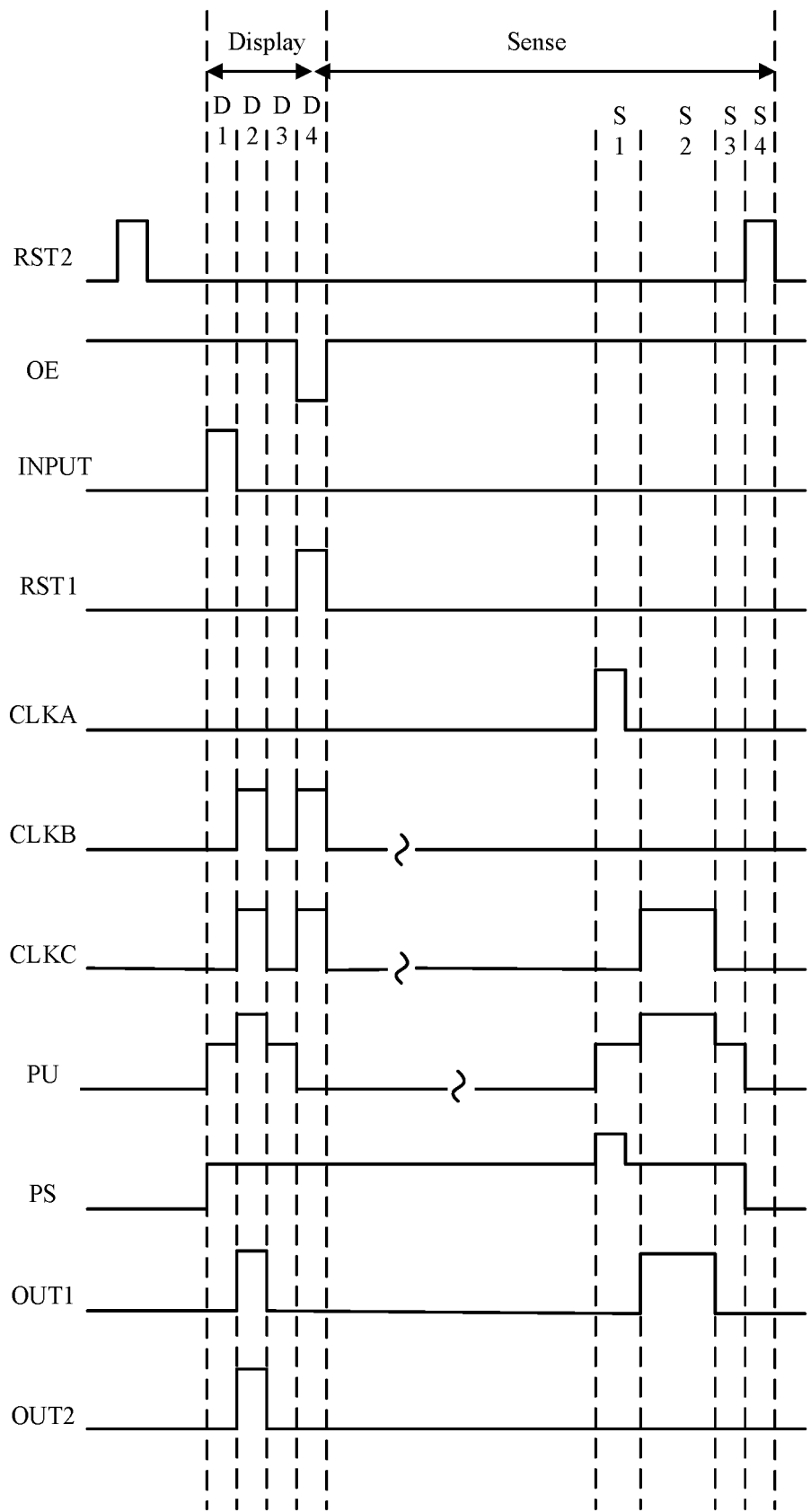
FIG. 12C is an operating timing diagram 3 of a shift register according to an exemplary embodiment.

Taking transistors M1 through M16 in a shift register provided by an exemplary embodiment as n-type thin film transistors as an example, FIG. 12A is an operating timing diagram 1 of a shift register according to an exemplary embodiment, FIG. 12B is an operation timing diagram 2 of a shift register according to an exemplary embodiment and FIG. 12C is an operating timing diagram 3 of a shift register according to an exemplary embodiment. As shown in FIG. 11 and FIG. 12, a shift register provided by an exemplary embodiment includes 16 transistors (M1 through M16), 2 capacitors (C1 and C2), 7 signal input terminals (INPUT, RST1, RST2, OE, CLKA, CLKB and CLKC), 2 signal output terminals (OUT1 and OUT2) and 3 power supply terminals (VDD, VGL1 and VGL2).

A first power supply terminal VDD continuously provides a high level signal. A second power supply terminal VGL1 and a third power supply terminal VGL2 continuously provide a low level signal.

A display panel includes a display stage (Display) and a sensing stage (Sense). In the display stage (Display), an input signal of a second reset terminal RST2 and an input signal of a first clock signal terminal CLKA are always at a low level. In the sensing phase (Sense), an input signal of a first reset terminal RST1, an input signal of a signal input terminal INPUT, an input signal of a random sensing signal terminal OE and an input signal of a second clock signal terminal CLKB are always at a low level.

Before the display stage (Display), the input signal of the second reset terminal RST2 is at a high level, which can turn on a fifteenth transistor M15 and a sixteenth transistor M16 in the shift register to initialize the potentials of a pull-up node PU and a sensing node PS.

In the display stage, the operating procedure of the shift register provided by the exemplary embodiment includes:

In a first stage D1, i.e., an input stage, the input signal of the signal input terminal INPUT and the input signal of the random sensing signal terminal OE are at a high level, a first transistor M1 and the second transistor M2 are turned on to pull up the potential of a sensing node PS, and charge a first capacitor C1, and a fourth transistor M4 is turned on. However, since a clock signal of the first clock signal terminal CLKA is at a low level, the potential of the pull-up node PU will not be affected by the clock signal of the first clock signal terminal CLKA. The sixth transistor M6 is turned on to pull up the potential of the pull-up node PU, and charge a second capacitor C2, and a seventh transistor M7 and an eighth transistor M8 are turned on. However, since a clock signal of a second clock signal terminal CLKB and a clock signal of a third clock signal terminal CLKC are at a low level, a first output terminal OUT1 and a second output terminal OUT2 have no output. Although a ninth transistor M9 is turned on under control of a first power supply terminal VDD, since a tenth transistor M10 is turned on under control of the pull-up node PU to pull down the potential of a pull-down node PD, an eleventh transistor M11, a twelfth transistor M12 and a thirteenth transistor M13 are turned off, the input signal of the first reset terminal RST1 is at a low level, and the third transistor M3 and a fourteenth transistor M14 are turned off, so the pull-up node PU maintains a high level.

In a second stage D2, i.e., an output stage, an input signal of the random sensing signal terminal OE continuously is at a high level, the second transistor M2 is turned on, the input signal of the signal input terminal INPUT is at a low level, the first transistor M1 and the sixth transistor M6 are turned off, and the potential of the sensing node PS is pulled up and the fourth transistor M4 is turned on under bootstrap action of the first capacitor C1. However, since the clock signal of the first clock signal terminal CLKA is at a low level, the potential of the pull-up node PU will not be affected by the clock signal of the first clock signal terminal CLKA. Under the bootstrap action of the second capacitor C2, the potential of the pull-up node PU is pulled up, and the seventh transistor M7 and the eighth transistor M8 are turned on. The clock signal of the second clock signal terminal CLKB and the clock signal of the third clock signal terminal CLKC are at a high level, and the first output terminal OUT1 and the second output terminal OUT2 output a high level signal. Although the ninth transistor M9 is turned on under control of the first power supply terminal VDD, but the tenth transistor M10 is turned on under control of the pull-up node PU to pull down the potential of the pull-down node PD, thus the eleventh transistor M11, the twelfth transistor M12 and the thirteenth transistor M13 are turned off. The input signal of the first reset terminal RST1 is at a low level, and the third transistor M3 and the fourteenth transistor M14 are turned off, so the pull-up node PU maintains at a high level.

In a third stage D3, the input signal of the random sensing signal terminal OE is still at a high level, the second transistor M2 is turned on, the input signal of the signal input terminal INPUT is still at a low level, the first transistor M1 and the sixth transistor M6 are turned off, and the potential of the sensing node PS starts to drop, but the fourth transistor M4 can still be turned on. Since the clock signal of the first clock signal terminal CLKA is at a low level, the potential of the pull-up node PU will not be affected by the clock signal of the first clock signal terminal CLKA. The potential of the pull-up node PU starts to drop, but the seventh transistor M7 and the eighth transistor M8 can still be turned on. Since the clock signal of the second clock signal terminal CLKB and the clock signal of the third clock signal terminal CLKC are at a low level, the first output terminal OUT1 and the second output terminal OUT2 have no output. Although the ninth transistor M9 is turned on under control of the first power supply terminal VDD, since the tenth transistor M10 can still be turned on under control of the pull-up node PU to pull down the potential of the pull-down node PD, the eleventh transistor M11, the twelfth transistor M12 and the thirteenth transistor M13 are still turned off. The input signal of the first reset terminal RST1 is at a low level, and the third transistor M3 and the fourteenth transistor M14 are still turned off.

In a fourth stage D4, i.e., a reset stage, the input signal of the random sensing signal terminal OE is still at a high level, the second transistor M2 is turned on, the input signal of the first reset terminal RST1 is at a high level, the third transistor M3 and the fourteenth transistor M14 are turned on to pull down the potentials of the pull-up node PU and the sensing node PS. The ninth transistor M9 is turned on under control of the first power supply terminal VDD to pull up the potential of the pull-down node PD. The tenth transistor M10 is turned off under control of the pull-up node PU, and the eleventh transistor M11, the twelfth transistor M12 and the thirteenth transistor M13 are turned on to pull down the signals of the pull-up node PU, the first output terminal OUT1 and the second output terminal OUT2 to reduce noise.

In the display stage, the input signal of the signal input terminal INPUT is a pulse signal, and is at a high level only in the input stage. An output signal of the first output terminal OUT1 and an output signal of the second output terminal OUT2 are pulse signals, and are at a high level only in the output stage. The signal of the first reset terminal RST1 is a pulse signal, and is at a high level only in the reset stage.

A random signal output by the random sensing signal terminal OE and an output signal output by a certain stage shift register in the display stage are inverted signals. Taking the random signal and the output signal of the Nth stage shift register as the inverted signal as an example, the random signals of the random sensing signal terminals OE from all shift registers except a (N−3)th stage shift register among a first stage shift register through a Nth stage shift register are always at a high level in the reset stage, that is, in the reset stage, the second transistor M2 and the third transistor M3 are turned on to pull down the potential of the sensing node PS. Other operating procedures are the same as those described above. The operating procedure of the (N−3)th stage shift register is different from the above-mentioned operating procedure in that the input signal of the random sensing signal terminal OE is at a low level in the reset stage, and the second transistor M2 is turned off and the third transistor M3 is turned on, so that the potential of the sensing node PS is not pulled down. Therefore, the potential of the sensing node PS in the (N−3)th stage shift register is always at high level. FIG. 12 illustrates with N=7 as an example, in which FIG. 12A illustrates an operating procedure of a first stage shift register through a fourth stage shift register as an example, FIG. 12B illustrates an operating procedure of a (N−2)th stage shift register through a Nth stage shift register as an example, and FIG. 12C illustrates a (N−3)th stage shift register as an example.

A pixel circuit to be detected depends on the input signal of the random sensing signal terminal OE. If the input signal of the random sensing signal terminal OE and an output signal of the Nth stage shift register are inverted signals, the pixel circuit to be detected is a pixel circuit connected with the (N−3)th stage shift register.

In the sensing stage, an operating procedure of the shift register connected with the pixel circuit to be detected includes:

In a first stage S1, the signal of the sensing node PS is at a high level, the fourth transistor M4 is turned on, the clock signal of the first clock signal terminal CLKA is at a high level, the fifth transistor M5 is turned on, the potential of the pull-up node PU is pulled up by the clock signal of the first clock signal terminal CLKA, and the seventh transistor M7 and the eighth transistor M8 are turned on. However, since the clock signal of the third clock signal terminal CLKC is at a low level, the first output terminal OUT1 has no output. Although the ninth transistor M9 is turned on under control of the first power supply terminal VDD, since the tenth transistor M10 is turned on under control of the pull-up node PU to pull down the potential of the pull-down node PD, the eleventh transistor M11, the twelfth transistor M12 and the thirteenth transistor M13 are turned off, and the potential of the pull-up node PU maintains at a high level.

In a second stage S2, the clock signal of the first clock signal terminal CLKA is at a low level, the fifth transistor M5 is turned off, the potential of the pull-up node PU is pulled up under the bootstrap action of the second capacitor C2, the seventh transistor M7 and the eighth transistor M8 are turned on, the clock signal of the third clock signal terminal CLKC is at a high level, and the first output terminal OUT1 outputs a high level signal. Although the ninth transistor M9 is turned on under control of the first power supply terminal VDD, since the tenth transistor M10 is turned on under control of the pull-up node PU to pull down the potential of the pull-down node PD, the eleventh transistor M11, the twelfth transistor M12, and the thirteenth transistor M13 are turned off, so that the potential of the pull-up node PU maintains at a high level.

In a third stage S3, the potential of the pull-up node PU starts to drop, but the seventh transistor M7 and the eighth transistor M8 can still be turned on. Since the clock signal of the third clock signal terminal CLKC is at a low level, the first output terminal OUT1 has no output. Although the ninth transistor M9 is turned on under control of the first power supply terminal VDD, since the tenth transistor M10 can still be turned on under control of the pull-up node PU to pull down the potential of the pull-down node PD, so that the eleventh transistor M11, the twelfth transistor M12 and the thirteenth transistor M13 are still turned off.

In a fourth stage S4, the input signal of the second reset terminal RST2 is at a high level, and the fifteenth transistor M15 and the sixteenth transistor M16 are turned on to pull down the potentials of the pull-up node PU and the sensing node PS. Although the ninth transistor M9 is turned on under control of the first power supply terminal VDD to pull up the potential of the pull-down node PD, since the tenth transistor M10 is turned off under control of the pull-up node PU, and the eleventh transistor M11, the twelfth transistor M12 and the thirteenth transistor M13 are turned on to pull down the pull-up node PU, the first output terminal OUT1 and the second output terminal OUT2, to reduce noise.

In an exemplary embodiment, as shown in FIG. 12, the other stage shift registers except the (N−3)th stage shift register have no output in the sensing stage.

According to FIG. 12C, the shift register can output multiple pulses, which can output a driving signal not only in the display stage, but also in the sensing stage.

Figure 13:
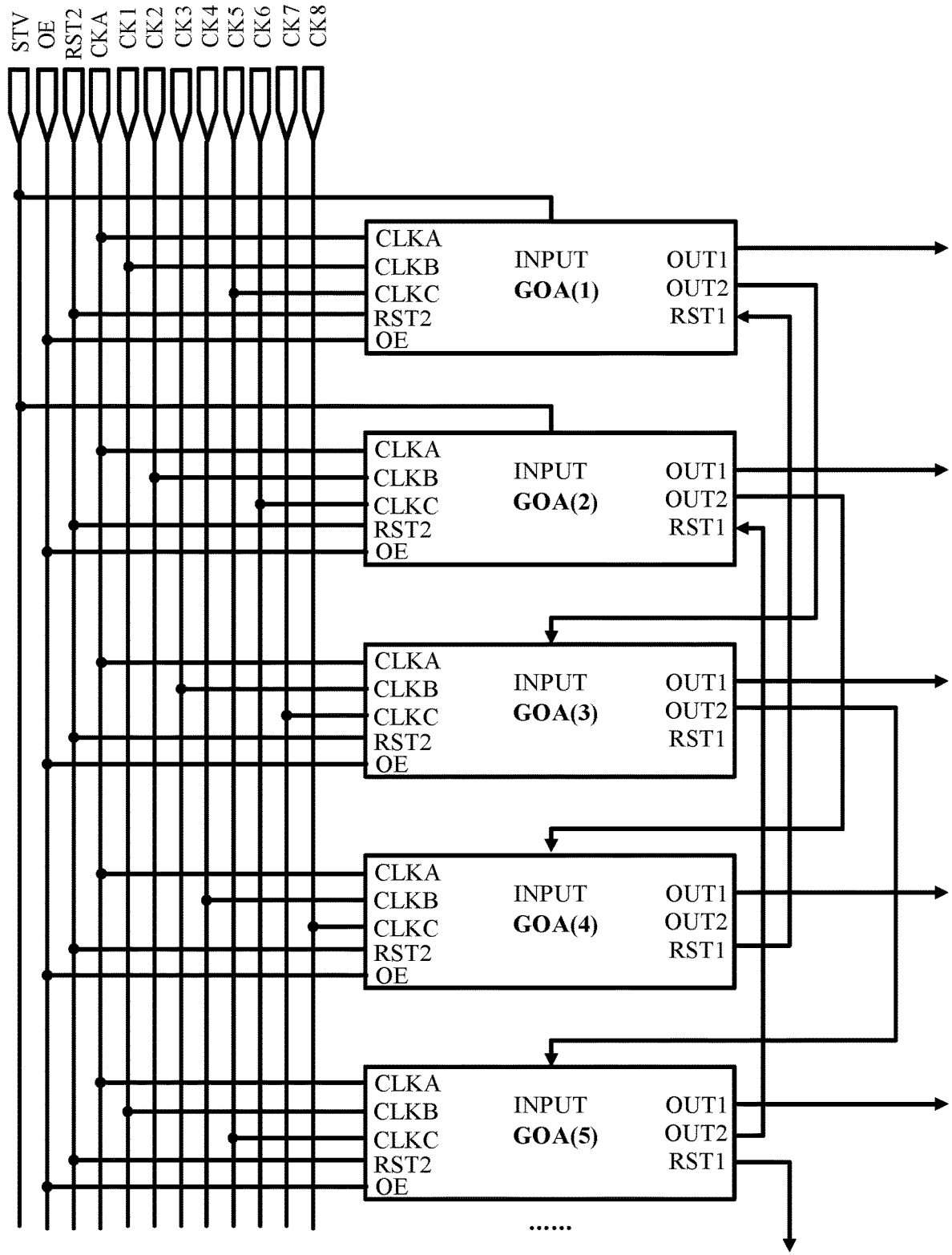
FIG. 13 is a schematic structural diagram of a gate driving circuit according to an embodiment of the present disclosure.

An embodiment of the present disclosure also provides a gate driving circuit. FIG. 13 is a schematic structural diagram of a gate driving circuit according to an embodiment of the present disclosure. As shown in FIG. 13, the gate driving circuit provided by the embodiment of the present disclosure includes a plurality of shift registers. A first stage shift register GOA(1) has a signal input terminal INPUT connected with an initial signal STV, a second stage shift register GOA(2) has a signal input terminal INPUT connected with the initial signal STV. A (N+2)th stage shift register GOA(N+2) has a signal input terminal INPUT connected with a second output OUT2 of a Nth stage shift register, and the Nth stage shift register has a first reset terminal RST1 connected with a second output OUT2 of a (N+3)th stage shift register, where N≥1, and N is an integer.

A third stage shift register GOA(3) has a signal input terminal INPUT connected with a second output OUT2 of the first stage shift register GOA(1), a fourth stage shift register GOA(4) has a signal input terminal INPUT connected with a second output OUT2 of the second stage shift register GOA(2), and so on. The first stage shift register GOA(1) has a first reset terminal RST1 connected with a second output terminal OUT2 of the fourth stage shift register GOA(4), The second stage shift register GOA(2) has a first reset terminal RST1 connected with a second output terminal OUT2 of a fifth stage shift register GOA(5), and so on.

In an exemplary embodiment, the second reset terminals RST2 of all shift registers may be connected with the same signal line. The first clock signal terminals CLKA of all shift registers may be connected with the same signal line CKA. The random sensing signal terminals OE of all shift registers can be connected with the same signal line.

As shown in FIG. 13, the gate driving circuit provided by the embodiment of the present disclosure may further include a first clock terminal CK1, a second clock terminal CK2, a third clock terminal CK3, a fourth clock terminal CK4, a fifth clock terminal CK5, a sixth clock terminal CK6, a seventh clock terminal CK7 and an eighth clock terminal CK8.

A (4i+1)th stage shift register GOA(4i+1) has a second clock signal terminal CLKB connected with the first clock terminal CK1, and the (4i+1)th stage shift register GOA(4i+1) has a third clock signal terminal CLKC connected with the fifth clock terminal CK5. A (4i+2)th stage shift register GOA(4i+2) has a second clock terminal CLKB connected with the second clock terminal CK2, and the (4i+2)th stage shift register GOA(4i+2) has a third clock signal terminal CLKC connected with the sixth clock terminal CK6. A (4i+3)th stage shift register GOA(4i+3) has a second clock signal terminal CLKB connected with the third clock terminal CK3, and the (4i+3)th stage shift register GOA(4i+3) has a third clock signal terminal CLKC connected with the seventh clock terminal CK7. A (4i+4)th stage shift register GOA(4i+4) has a second clock signal terminal CLKB connected with the fourth clock terminal CK4, and the (4i+4)th stage shift register GOA(4i+4) has a third clock signal terminal CLKC connected with the eighth clock terminal CK8.

The shift register is a shift register provided in any of the aforementioned embodiments with similar implementation principle and implementation effect, and will not be described again here.

Figure 14:
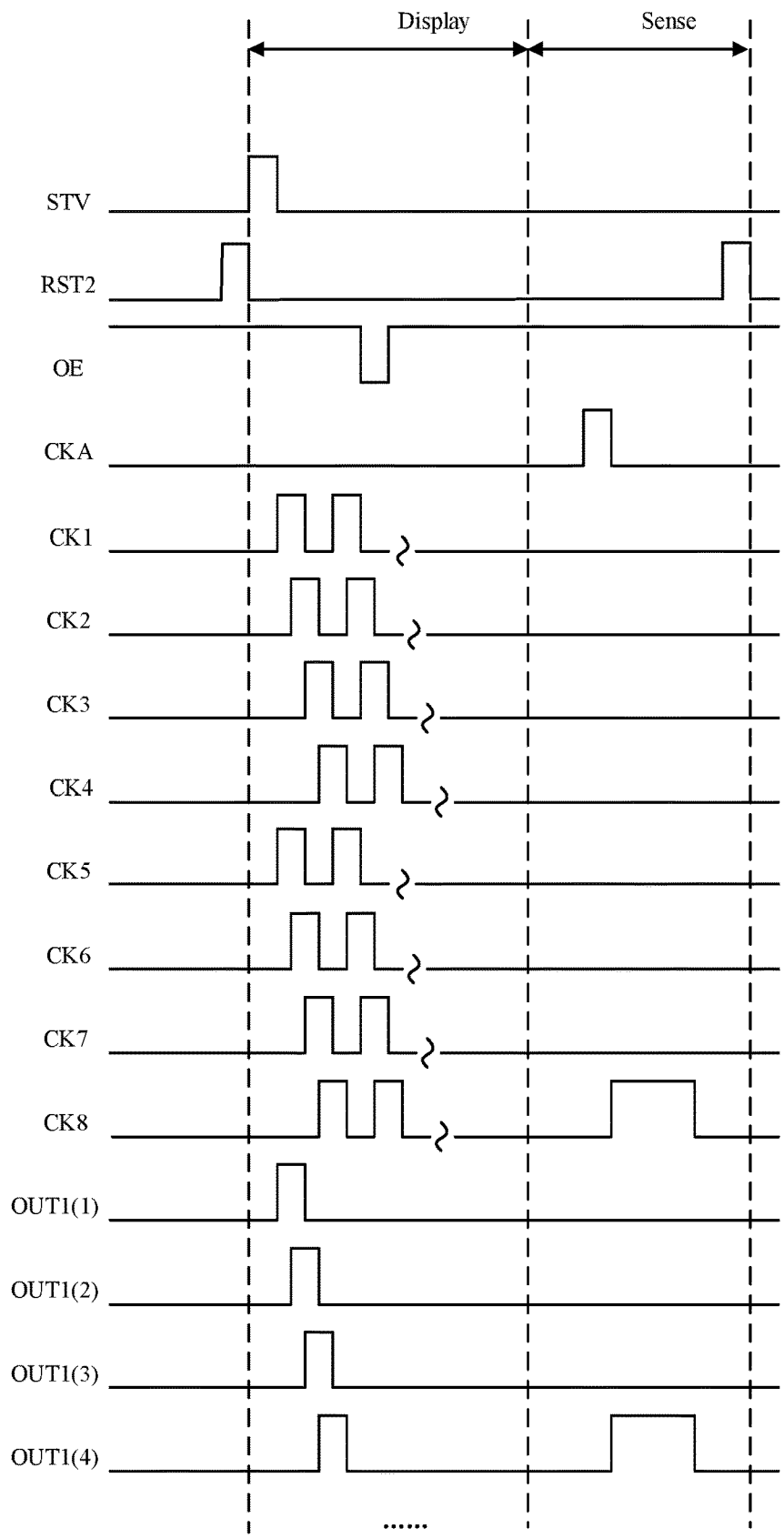
FIG. 14 is an operating timing diagram of a gate driving circuit provided according to an exemplary embodiment.

FIG. 14 is an operating timing diagram of a gate driving circuit according to an exemplary embodiment. FIG. 14 illustrates sensing of pixel circuits in a fourth row as an example, and OUT1(i) represents a first output terminal of an ith stage shift register.

As shown in FIG. 14, in a display stage, a clock signal of a first clock terminal CK1 and a clock signal of a fifth clock terminal CK5 are the same, a clock signal of a second clock terminal CK2 and a clock signal of a sixth clock terminal CK6 are the same, a clock signal of a third clock terminal CK3 and a clock signal of a seventh clock terminal CK7 are the same, a clock signal of a fourth clock terminal CK4 and a clock signal of an eighth clock terminal CK8 are the same, the clock signal of the first clock terminal CK1 and the clock signal of the third clock terminal CK3 are mutually inverted signals, and the clock signal of the second clock terminal CK2 and the clock signal of the fourth clock are mutually inverted signals. In a sensing stage, a clock signal of a clock terminal connected with a shift register connected with the pixel circuit to be detected is at a high level, while the clock signals of the clock terminals connected with the rest shift register are at a low level. Only a first output terminal of the shift register connected with the pixel circuit to be detected outputs multiple pulses, and the rest shift registers only output a single pulse.

An embodiment of the disclosure also provides a driving method of a shift register, which is applied to the shift register, and the shift register is disposed in a display panel, and the display panel comprises a display stage and a sensing stage. The driving method of the shift register according to the embodiment of the present disclosure includes the following steps:

At step 100, in a display stage, an input sub-circuit provides a signal of a first power supply terminal to a pull-up node under control of a signal input terminal; a output sub-circuit provides a signal of a third clock signal terminal to a first output terminal and provides a signal of a second clock signal terminal to a second output terminal under control of the pull-up node; a first reset sub-circuit provides a signal of the second power supply terminal to the pull-up node under control of a first reset terminal; and a pull-down sub-circuit provides the signal of the second power supply terminal to the pull-up node and the second output terminal and provides a signal of a third power supply terminal to the first output terminal under control of the first power supply terminal and the pull-up node.

At step 200, in a sensing stage, a sensing control sub-circuit provides a signal of a first clock signal terminal to the pull-up node under control of the signal input terminal, a random sensing signal terminal, the first clock signal terminal and the first reset terminal; and the output sub-circuit provides the signal of the third clock signal terminal to the first output terminal under control of the pull-up node.

The shift register is a shift register provided in any of the aforementioned embodiments with similar implementation principle and implementation effect, thus will not be described again here.

In an exemplary embodiment, the driving method of the shift register provided by the exemplary embodiment may further include: in the sensing stage, a second reset sub-circuit provides the signal of the second power supply terminal to the pull-up node and the sensing node under control of the second reset terminal.

The drawings in the present disclosure only involve the structures included in the embodiments of the present disclosure, and other structures may refer to common designs.

Although the embodiments disclosed in the present disclosure are as described above, the described contents are only the embodiments for facilitating understanding of the present disclosure, which are not intended to limit the present disclosure. Those skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What we claimed is:

1. A shift register, comprising:
an input sub-circuit, a sensing control sub-circuit, an output sub-circuit, a first reset sub-circuit and a pull-down sub-circuit;
the input sub-circuit is connected with a signal input terminal, a first power supply terminal and a pull-up node respectively, and is configured to provide a signal of the first power supply terminal to the pull-up node under control of the signal input terminal;
the sensing control sub-circuit is connected with a random sensing signal terminal, the signal input terminal, a first clock signal terminal, a first reset terminal and the pull-up node respectively and is configured to provide a signal of the first clock signal terminal to the pull-up node under control of the signal input terminal, the random sensing signal terminal, the first clock signal terminal and the first reset terminal;
the first reset sub-circuit is connected with the first reset terminal, the pull-up node and a second power supply terminal respectively, and is configured to provide a signal of the second power supply terminal to the pull-up node under control of the first reset terminal;
the output sub-circuit is connected with a second clock signal terminal, a third clock signal terminal, the pull-up node, a first output terminal and a second output terminal respectively, and is configured to provide a signal of the third clock signal terminal to the first output terminal and provide a signal of the second clock signal terminal to the second output terminal under control of the pull-up node; and
the pull-down sub-circuit is connected with the first power supply terminal, the second power supply terminal, a third power supply terminal, the pull-up node, the first output terminal and the second output terminal respectively, and is configured to provide the signal of the second power supply terminal to the pull-up node and the second output terminal, and provide a signal of the third power supply terminal to the first output terminal under control of the first power supply terminal and the pull-up node.

2. The shift register according to claim 1, wherein the sensing control sub-circuit comprises a sensing node control sub-circuit and a sensing output sub-circuit;
the sensing node control sub-circuit is connected with the signal input terminal, a sensing node, the random sensing signal terminal, the pull-up node and the first reset terminal respectively, and is configured to provide a signal of the signal input terminal or a signal of the pull-up node to the sensing node under control of the signal input terminal, the random sensing signal terminal and the first reset terminal; and
the sensing output sub-circuit is connected with the sensing node, the first clock signal terminal and the pull-up node respectively, and is configured to provide the signal of the first clock signal terminal to the pull-up node under control of the first clock signal terminal and the sensing node.

3. The shift register according to claim 2, wherein the sensing node control sub-circuit comprises a first transistor, a second transistor and a third transistor;
a control electrode and a first electrode of the first transistor are connected with the signal input terminal, and a second electrode of the first transistor is connected with the sensing node;
a control electrode of the second transistor is connected with the random sensing signal terminal, a first electrode of the second transistor is connected with the sensing node, and a second electrode of the second transistor is connected with a first electrode of the third transistor; and
a control electrode of the third transistor is connected with the first reset terminal, and a second electrode of the third transistor is connected with the pull-up node.

4. The shift register according to claim 2, wherein the sensing output sub-circuit comprises a fourth transistor, a fifth transistor and a first capacitor;
a control electrode of the fourth transistor is connected with the sensing node, a first electrode of the fourth transistor is connected with a first clock signal terminal, and a second electrode of the fourth transistor is connected with a first electrode of the fifth transistor;

a control electrode of the fifth transistor is connected with the first clock signal terminal, and a second electrode of the fifth transistor is connected with the pull-up node;

a first terminal of the first capacitor is connected with the sensing node, and a second terminal of the first capacitor is connected with the second electrode of the fourth transistor.

5. The shift register according to claim 1, further comprising: a second reset sub-circuit;

the second reset sub-circuit is connected with a second reset terminal, the pull-up node, the sensing node and the second power supply terminal respectively, and is configured to provide the signal of the second power supply terminal to the pull-up node and the sensing node under control of the second reset terminal.

6. The shift register according to claim 5, wherein the second reset sub-circuit comprises a fifteenth transistor and a sixteenth transistor;

a control electrode of the fifteenth transistor is connected with the second reset terminal, a first electrode of the fifteenth transistor is connected with the sensing node, and a second electrode of the fifteenth transistor is connected with the pull-up node; and a control electrode of the sixteenth transistor is connected with the second reset terminal, a first electrode of the sixteenth transistor is connected with the pull-up node, and a second electrode of the sixteenth transistor is connected with the second power supply terminal.

7. The shift register according to claim 1, wherein the input sub-circuit comprises a sixth transistor;

a control electrode of the sixth transistor is connected with the signal input terminal, a first electrode of the sixth transistor is connected with the first power supply terminal, and a second electrode of the sixth transistor is connected with the pull-up node.

8. The shift register according to claim 1, wherein the output sub-circuit comprises a seventh transistor, an eighth transistor and a second capacitor;

a control electrode of the seventh transistor is connected with the pull-up node, a first electrode of the seventh transistor is connected with the second clock signal terminal, and a second electrode of the seventh transistor is connected with the second output terminal;

a control electrode of the eighth transistor is connected with the pull-up node, a first electrode of the eighth transistor is connected with the third clock signal terminal, and a second electrode of the eighth transistor is connected with the first output terminal; and a first terminal of the second capacitor is connected with the pull-up node, and a second terminal of the second capacitor is connected with the first output terminal.

9. The shift register according to claim 1, wherein the pull-down sub-circuit includes: a ninth transistor, a tenth transistor, an eleventh transistor, a twelfth transistor, and a thirteenth transistor;

a control electrode and a first electrode of the ninth transistor are connected with the first power supply terminal, and a second electrode of the ninth transistor is connected with a pull-down node;

a control electrode of the tenth transistor is connected with the pull-up node, a first electrode of the tenth transistor is connected with the pull-down node, and a second electrode of the tenth transistor is connected with the second power supply terminal;

a control electrode of the eleventh transistor is connected with the pull-down node, a first electrode of the eleventh transistor is connected with the pull-up node, and a second electrode of the eleventh transistor is connected with the second power supply terminal;

a control electrode of the twelfth transistor is connected with the pull-down node, a first electrode of the twelfth transistor is connected with the second output terminal, and a second electrode of the twelfth transistor is connected with the second power supply terminal; and a control electrode of the thirteenth transistor is connected with the pull-down node, a first electrode of the thirteenth transistor is connected with the first output terminal, and a second electrode of the thirteenth transistor is connected with the third power supply terminal.

10. The shift register according to claim 1, wherein the first reset sub-circuit comprises a fourteenth transistor;

a control electrode of the fourteenth transistor is connected with the first reset terminal, a first electrode of the fourteenth transistor is connected with the pull-up node, and a second electrode of the fourteenth transistor is connected with the second power supply terminal.

11. The shift register according to claim 1, further comprising: a second reset sub-circuit;

wherein the sensing control sub-circuit comprises a first transistor, a second transistor, a third transistor, a fourth transistor, a fifth transistor and a first capacitor; the input sub-circuit includes a sixth transistor; the output sub-circuit comprises a seventh transistor, an eighth transistor and a second capacitor; the pull-down sub-circuit comprises a ninth transistor, a tenth transistor, an eleventh transistor, a twelfth transistor and a thirteenth transistor; the first reset sub-circuit includes a fourteenth transistor; the second reset sub-circuit comprises a fifteenth transistor and a sixteenth transistor;

a control electrode and a first electrode of the first transistor are connected with the signal input terminal, and a second electrode of the first transistor is connected with a sensing node;

a control electrode of the second transistor is connected with the random sensing signal terminal, a first electrode of the second transistor is connected with the sensing node, and a second electrode of the second transistor is connected with a first electrode of the third transistor;

a control electrode of the third transistor is connected with the first reset terminal, and a second electrode of the third transistor is connected with the pull-up node;

a control electrode of the fourth transistor is connected with the sensing node, a first electrode of the fourth transistor is connected with the first clock signal terminal, and a second electrode of the fourth transistor is connected with a first electrode of the fifth transistor;

a control electrode of the fifth transistor is connected with the first clock signal terminal, and a second electrode of the fifth transistor is connected with the pull-up node;

a first terminal of the first capacitor is connected with the sensing node, and a second terminal of the first capacitor is connected with the second electrode of the fourth transistor;

a control electrode of the sixth transistor is connected with the signal input terminal, a first electrode of the sixth transistor is connected with the first power supply terminal, and a second electrode of the sixth transistor is connected with the pull-up node;

a control electrode of the seventh transistor is connected with the pull-up node, a first electrode of the seventh transistor is connected with the second clock signal terminal, and a second electrode of the seventh transistor is connected with the second output terminal;

a control electrode of the eighth transistor is connected with the pull-up node, a first electrode of the eighth transistor is connected with the third clock signal terminal, and a second electrode of the eighth transistor is connected with the first output terminal;

a first terminal of the second capacitor is connected with the pull-up node, and a second terminal of the second capacitor is connected with the first output terminal;

a control electrode and a first electrode of the ninth transistor are connected with the first power supply terminal, and a second electrode of the ninth transistor is connected with a pull-down node;

a control electrode of the tenth transistor is connected with the pull-up node, a first electrode of the tenth transistor is connected with the pull-down node, and a second electrode of the tenth transistor is connected with the second power supply terminal;

a control electrode of the eleventh transistor is connected with the pull-down node, a first electrode of the eleventh transistor is connected with the pull-up node, and a second electrode of the eleventh transistor is connected with the second power supply terminal;

a control electrode of the twelfth transistor is connected with the pull-down node, a first electrode of the twelfth transistor is connected with the second output terminal, and a second electrode of the twelfth transistor is connected with the second power supply terminal;

a control electrode of the thirteenth transistor is connected with the pull-down node, a first electrode of the thirteenth transistor is connected with the first output terminal, and a second electrode of the thirteenth transistor is connected with the third power supply terminal;

a control electrode of the fourteenth transistor is connected with the first reset terminal, a first electrode of the fourteenth transistor is connected with the pull-up node, and a second electrode of the fourteenth transistor is connected with the second power supply terminal;

a control electrode of the fifteenth transistor is connected with a second reset terminal, a first electrode of the fifteenth transistor is connected with the sensing node, and a second electrode of the fifteenth transistor is connected with the pull-up node; and a control electrode of the sixteenth transistor is connected with the second reset terminal, a first electrode of the sixteenth transistor is connected with the pull-up node, and a second electrode of the sixteenth transistor is connected with the second power supply terminal.

12. A gate driving circuit, comprising a plurality of cascaded shift registers according to claim 1;

a first stage shift register has a signal input terminal connected with an initial signal terminal, a second stage shift register has a signal input terminal connected with the initial signal terminal, a (N+2)th stage shift register has a signal input terminal connected with a second output terminal of a Nth stage shift register, and the Nth stage shift register has a first reset terminal connected with a second output terminal of the (N+3)th stage shift register, N1 ≥1.

13. The gate driving circuit according to claim 12, wherein the gate driving circuit comprises a first clock terminal, a second clock terminal, a third clock terminal, a fourth clock terminal, a fifth clock terminal, a sixth clock terminal, a seventh clock terminal and an eighth clock terminal;

a (4i+1)th stage shift register has a second clock signal terminal connected with the first clock terminal, the (4i+1)th stage shift register has a third clock signal terminal connected with the fifth clock terminal, a (4i+2)th stage shift register has a second clock signal terminal connected with the second clock terminal, the (4i+2)th stage shift register has a third clock signal terminal connected with the sixth clock terminal, a (4i+3)th stage shift register has a second clock signal terminal connected with the third clock terminal, the (4i+3)th stage shift register has a third clock signal terminal connected with the seventh clock terminal, a (4i+4)th stage shift register has a second clock signal terminal connected with the fourth clock terminal, and the (4i+4)th stage shift register has a third clock signal terminal connected with the eighth clock terminal.

14. A driving method for a shift register, which is applied to the shift register according to claim 1, wherein the shift register is disposed in a display panel, and the display panel comprises a display stage and a sensing stage, and the method comprises:

in the display stage, providing the signal of the first power supply terminal to the pull-up node by the input sub-circuit under control of the signal input terminal;

providing the signal of the third clock signal terminal to the first output terminal and providing the signal of the second clock signal terminal to the second output terminal by the output sub-circuit under control of the pull-up node;

providing the signal of the second power supply terminal to the pull-up node by the first reset sub-circuit under control of the first reset terminal;

providing the signal of the second power supply terminal to the pull-up node and the second output terminal and providing the signal of the third power supply terminal to the first output terminal by the pull-down sub-circuit under control of the first power supply terminal and the pull-up node; and in the sensing stage, providing the signal of the first clock signal terminal to the pull-up node by the sensing control sub-circuit under control of the signal input terminal, the random sensing signal terminal, the first clock signal terminal and the first reset terminal, and providing the signal of the third clock signal terminal to the first output terminal by the output sub-circuit under control of the pull-up node.

15. The method according to claim 14, further comprising: in the sensing stage, providing the signal of the second power supply terminal to the pull-up node and a sensing node by a second reset sub-circuit under control of a second reset terminal.

* * * * *